United States Patent
Ashman et al.

(10) Patent No.: US 6,928,727 B2
(45) Date of Patent: Aug. 16, 2005

(54) APPARATUS AND METHOD FOR MAKING ELECTRICAL CONNECTORS

(75) Inventors: John J. Ashman, Murrells Inlet, SC (US); Monroe Waymer, Orangeburg, SC (US); Jennifer Hammond, Garden City, SC (US)

(73) Assignee: AVX Corporation, Myrtle Beach, SC (US)

( * ) Notice: Subject to any disclaimer, the term of this patent is extended or adjusted under 35 U.S.C. 154(b) by 546 days.

(21) Appl. No.: 10/208,538

(22) Filed: Jul. 30, 2002

(65) Prior Publication Data

US 2004/0020044 A1 Feb. 5, 2004

(51) Int. Cl.[7] .................................................. H01R 9/00
(52) U.S. Cl. .................... 29/843; 825/842; 825/845; 825/878; 825/879; 228/180.1; 228/180.21
(58) Field of Search ..................... 29/825, 842, 843, 29/844, 878, 879; 228/180.1, 180.21

(56) References Cited

U.S. PATENT DOCUMENTS

| | | |
|---|---|---|
| 3,320,658 A | 5/1967 | Bolda et al. |
| 3,719,981 A | 3/1973 | Steiz |
| 4,056,302 A | 11/1977 | Braun et al. |
| 4,097,266 A | 6/1978 | Takahashi et al. |

(Continued)

FOREIGN PATENT DOCUMENTS

| | | |
|---|---|---|
| EP | 0548583 | 6/1993 |
| EP | 0548585 | 6/1993 |
| EP | 0706314 | 4/1996 |
| EP | 0716483 | 12/1997 |

(Continued)

OTHER PUBLICATIONS

Research Disclosure, Oct. 1992, No. 342, Kenneth Mason Publications Ltd., England; entitled "Solder Ball Connect Pin Grid Array Package".

Kazmierowicz, "The Science Behind Conveyor Oven Thermal Profiling", pp. 1–9, Surface Mount Technology, Feb. 1990.

U.S. Appl. No. 10/208,233 filed Jul. 30, 2002, entitled "Apparatus and Method for Retaining and Placing Electrical Components" (ELX–94).

(Continued)

Primary Examiner—Carl J. Arbes
(74) Attorney, Agent, or Firm—Dority & Manning, P.A.

(57) ABSTRACT

A method and apparatus for manufacturing an electrical connection unit and connector array is provided. Such arrays may be used to solder together traces from opposed circuit boards, in which the array is fitted between, and soldered to the boards to complete a circuit. The method of manufacturing a connection unit includes providing a first insulative base with one or more contacts or contact groups extending from the first side towards the second side of the base. Solder portions or solder balls may be reflowed to contacts at their termination points. An apparatus and method may provide a solder positioning device or means on top of or adjacent to the first insulative base, so that solder portions or solder balls are placed within cavities in the positioning device, in alignment with apertures of the first insulative base. The connection unit may be heated to reflow and fuse the solder portions to the contact termination, thereby constructing an array.

26 Claims, 23 Drawing Sheets

U.S. PATENT DOCUMENTS

| | | |
|---|---|---|
| 4,175,821 A | 11/1979 | Hunter |
| 4,462,534 A | 7/1984 | Bitaillou et al. |
| 4,701,133 A | 10/1987 | Worth |
| 5,055,971 A | 10/1991 | Fudala et al. |
| 5,098,311 A | 3/1992 | Roath et al. |
| 5,299,939 A | 4/1994 | Walker et al. |
| 5,306,171 A | 4/1994 | Marshall |
| 5,324,569 A | 6/1994 | Nagesh et al. |
| 5,346,118 A | 9/1994 | Degani et al. |
| 5,355,283 A | 10/1994 | Marrs et al. |
| 5,406,701 A | 4/1995 | Pepe et al. |
| 5,409,157 A | 4/1995 | Nagesh et al. |
| 5,435,482 A | 7/1995 | Variot et al. |
| 5,442,852 A | 8/1995 | Danner |
| 5,477,933 A | 12/1995 | Nguyen |
| 5,491,303 A | 2/1996 | Weiss |
| 5,576,519 A | 11/1996 | Swamy |
| 5,593,322 A | 1/1997 | Swamy et al. |
| 5,615,477 A | 4/1997 | Sweitzer |
| 5,653,598 A | 8/1997 | Grabbe |
| 5,691,041 A | 11/1997 | Frankeny et al. |
| 5,702,255 A | 12/1997 | Murphy et al. |
| 5,730,606 A | 3/1998 | Sinclair |
| 5,772,451 A | 6/1998 | Dozier, II et al. |
| 5,873,162 A | 2/1999 | Acciai et al. |
| 5,876,219 A | 3/1999 | Taylor et al. |
| 5,893,763 A | 4/1999 | O'Connor et al. |
| 5,899,760 A | 5/1999 | Ho et al. |
| 6,024,584 A | 2/2000 | Lemke et al. |
| 6,041,495 A | 3/2000 | Yoon et al. |
| 6,042,389 A | 3/2000 | Lemke et al. |
| 6,079,991 A | 6/2000 | Lemke et al. |
| 6,093,035 A | 7/2000 | Lemke et al. |
| 6,093,042 A | 7/2000 | Lemke et al. |
| 6,116,923 A | 9/2000 | Szu |
| 6,155,848 A | 12/2000 | Lin |
| 6,155,860 A | 12/2000 | Lemke et al. |
| 6,164,983 A | 12/2000 | Lemke et al. |
| 6,183,268 B1 | 2/2001 | Consoli et al. |
| 6,193,537 B1 | 2/2001 | Harper, Jr. et al. |
| 6,241,535 B1 | 6/2001 | Lemke et al. |
| 6,264,490 B1 | 7/2001 | Lemke et al. |
| 6,284,984 B1 | 9/2001 | Ohyama |
| 6,313,999 B1 | 11/2001 | Fratti et al. |
| 6,325,644 B1 | 12/2001 | Lemke et al. |
| 6,330,164 B1 | 12/2001 | Khandros et al. |
| 6,336,823 B2 | 1/2002 | Lemke et al. |
| 6,375,474 B1 | 4/2002 | Harper, Jr. et al. |
| 6,394,822 B1 | 5/2002 | McNamara |
| 6,471,526 B1 | 10/2002 | Harper, Jr. |
| 6,494,725 B2 | 12/2002 | Lin et al. |
| 6,527,597 B1 | 3/2003 | Harper, Jr. |
| 6,561,819 B1 | 5/2003 | Huang |

FOREIGN PATENT DOCUMENTS

| | | |
|---|---|---|
| EP | 1109265 | 6/2001 |
| EP | 1150390 | 10/2001 |
| GB | 2282798 | 4/1995 |
| JP | 09083127 | 3/1997 |
| WO | 9966599 | 12/1999 |

OTHER PUBLICATIONS

U.S. Appl. No. 10/208,537 filed Jul. 30, 2002, entitled "Electrical Connector" (ELX–97).

U.S. Appl. No. 10/208,236 filed Jul. 30, 2002, entitled "Electrical connectors and Electrical Components" (ELX–99).

IBM Technical Disclosure Bulletin, vol. 32, No. 11.; entitled "Application of Precision Solder Volumes to Surface Pads", Apr. 1990.

Research Disclosure, Aug. 1990, No. 316, Kenneth Mason Publications Ltd., England; entitled "Integrated Surface Mount Module I/O Attach".

Alphametals: The First Word in Advanced Preform Technology; entitled "MEI" Micro Electronic Interconnects.

Great Britain Patent Office Search Report, Oct. 10, 2003.

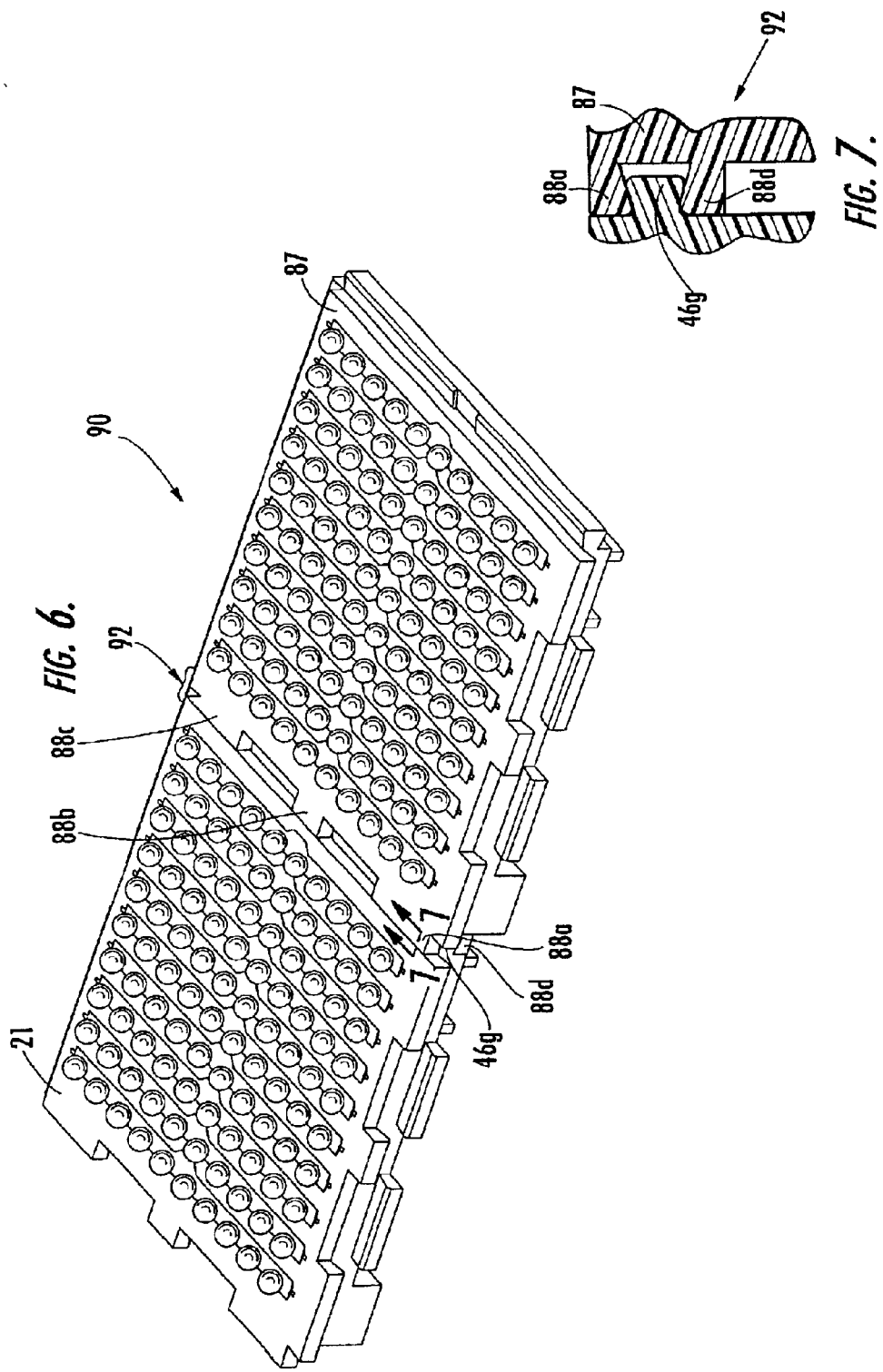

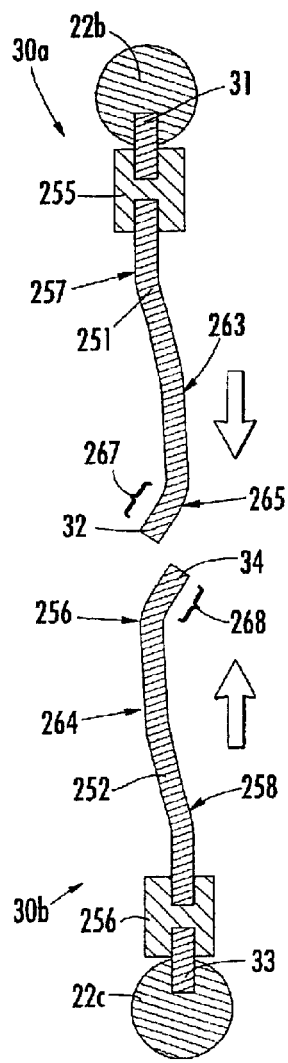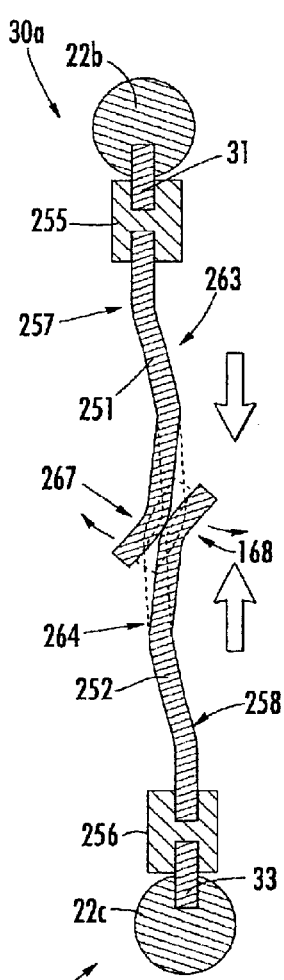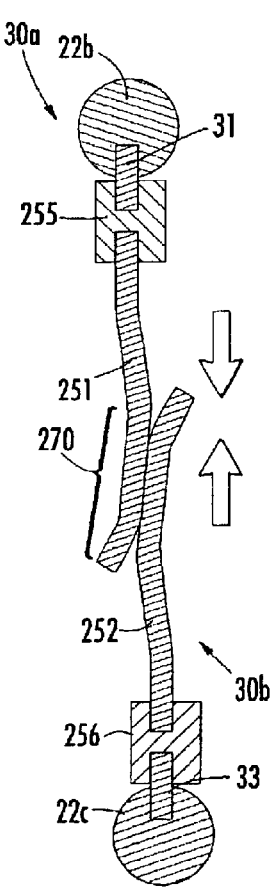
FIG. 18.
FIG. 19.
FIG. 20.

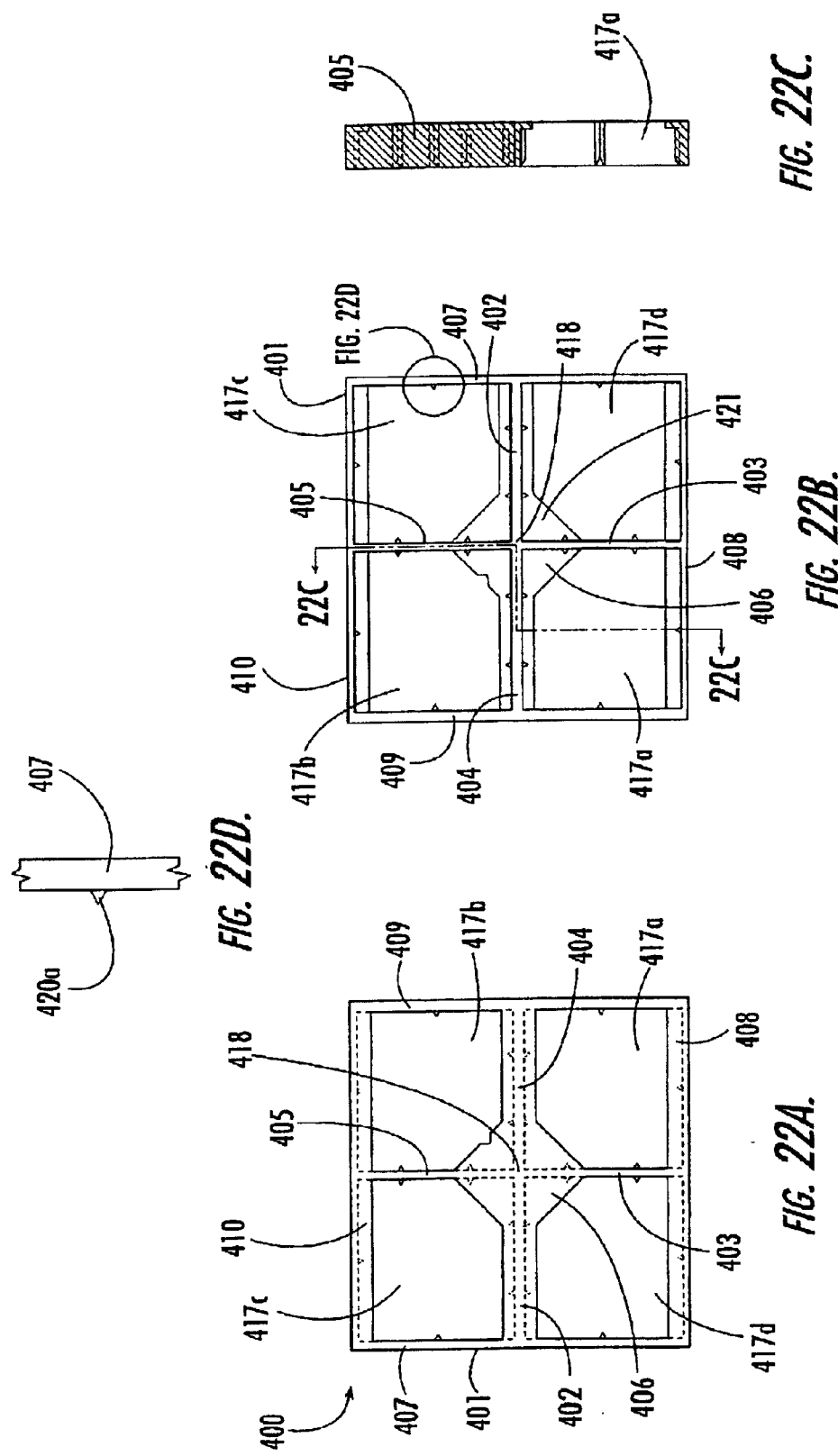

APPARATUS AND METHOD FOR MAKING ELECTRICAL CONNECTORS

CROSS REFERENCE TO RELATED APPLICATIONS

This application was filed concurrently with three other related applications: (1) "Apparatus and Methods for Retaining and Placing Electrical Components", by Ashman et al., filed Jul. 30, 2002; (2) "Electrical Connector", by Ashman et al., filed Jul. 30, 2002; (3) "Electrical Connectors and Electrical Components", by Ashman et al., filed Jul. 30, 2002.

BACKGROUND OF THE INVENTION

Electrical connectors are provided in many different varieties for numerous applications. In the computer and microelectronics industry, electrical connectors may be provided in two separate portions designed to mate with each other. There is an incentive in the industry to provide smaller connectors. Connectors may be employed to electrically join conductive traces from one circuit board to another. Such a connector may provide a grid or array of connection points on opposite surfaces. A two-part connector may be electrically mated on a mating surface and then meshed to conductive traces of the circuit board on opposite mounting surfaces.

Ball grid array connectors typically use solder portions known as "solder balls" on the ends of contact elements. Solder balls may be positioned and then reflowed upon a contact, thereby providing the connector with an electrical pathway to a conductive trace or circuit board. When a solder ball or an array of balls are placed against a circuit board, the solder ball may be heated and reflowed to melt the balls upon the conductive trace, resulting in a secure soldered electrical connection. Many different types of ball grid array connectors are known.

Many prior art connection devices use a gender specific first part employing a male contact portion that is designed for mating with a female receiver which has a different configuration. Thus, the first "male" portion inserts into a cavity or "female" portion, which results in a secure electrical connection.

Unfortunately, the use of gender specific connector parts is costly. Distributors and manufacturers employing such connectors must stock and hold inventory for both the male and female parts. This undesirably increases the amount of inventory that must be maintained. Furthermore, having both male and female portions sometimes results in confusion regarding which part is needed when orders are placed. This problem may be compounded when multiple sized arrays are used. For example, if specific connector arrays of 100, 200, 400, and 800 contacts are needed in the industry, then a manufacturer usually must have assembly lines, drawings, tooling, part numbers, packaging and the like to correspond with each and every different sized array that must be manufactured for the various end users. If gender-specific male and female components are used, the number of separate parts employed is increased by a factor of two. The large number of separate parts needed to make each array combination is a significant limitation.

Another problem with male/female combination contacts is that in many such devices, only one gender portion undergoes displacement. That is, it is common that only one of such a mated pair actually is displaced when mating occurs. For connectors to achieve smaller size, the distance or space within the housing that is available for displacement of contacts is sometimes a critical factor. An arrangement that is capable of minimizing the total linear displacement required for contact elements to resilient mate within a connector housing while still achieving satisfactory electrical conductivity would be highly desirable.

Some prior art methods and apparatus employ indentations or depressed portions in the insulative base material. During manufacture, solder portions are placed in such indentations for reflow to contacts. However, the use of indentations in an insulative base requires relatively precise machining of the insulative base. This sometimes increases the cost of such components. Furthermore, disturbances or voids in such a base unit may undesirably weaken the unit. This may require that the base unit having such voids be engineered with an even greater thickness to provide a comparable strength.

It would be desirable to provide an apparatus and method for manufacturing connector arrays that employs insulative bases having relatively flat surfaces. A method or apparatus that provides a means to provide solder portions upon a flat surface which are fused upon contacts, would be desirable. A connector array that makes available numerous connection sites in a relatively precise geometrical arrangement that uses only small amounts of material would be desirable. Furthermore, a connection device or system that avoids the need to make and stock excess parts by avoiding the employment of both male and female portions in a multi-part connector would be very helpful. An array that is modular, and which can be assimilated into large groups for larger arrays, or smaller groups for smaller arrays, would also be very useful.

SUMMARY OF THE INVENTION

A method and apparatus for manufacturing an electrical connection unit having an array of solder portions along a plane is disclosed. The method comprises providing a first insulative base, the first insulative base having a first side located in a top plane, a second side, and a plurality of apertures extending between the first side and second side. Apertures may be adapted to receive contacts by insertion. The contacts each comprise a first end and a second end, the first end being positioned near the top plane of the first side.

A solder positioning device may be applied adjacent the first side of the first insulative base along the top plane. Such a solder positioning device provides cavities positioned in alignment with apertures of the first insulative base. Typically, the first ends of the respective contacts are positioned adjacent to or within the respective cavities. Solder portions may be inserted into the cavities, thereby contacting the first end of the contacts with the respective solder portions. Heat is applied, thereby fusing the solder portions with respective first end of the contacts. An electrical connector may be formed with at least one fused solder portion in the top plane.

In an alternate embodiment of the invention, an apparatus and a method of making a connector using a solder carrier applied from beneath an insulative base is employed. In this method, a first insulative base is provided, the first insulative base having a lower side, an upper side, and at least one aperture extending from the lower side to the upper side. At least one contact is provided within an aperture, the contact extending from the lower side towards the upper side. The contact provides a first end positioned near the lower side of the first insulative base. Next, it is possible to provide a solder carrier adjacent to and beneath the first insulative base, the solder carrier facing the lower side of the first insulative base. The solder carrier may include notches on its upper surface. A solder portion may be deposited into a notch, thereby forming a "loaded" notch. Then, the "loaded" notch may be placed in alignment with an aperture of the first insulative base, such that the first end of the contact is positioned within the loaded notch. At this point, heat may be applied to fuse the solder portion to the first end of the contact, forming an electrical connection unit having at least one fused contact.

BRIEF DESCRIPTION OF THE DRAWINGS

A full and enabling disclosure of this invention, including the best mode shown to one of ordinary skill in the art, is set forth in this specification. The following Figures illustrate the invention:

FIG. 6 is a combined modular unit showing two first connection units mated in a side-by-side relationship, with connectors and solder portions in each insulative base;

FIG. 7 is a cross-sectional view along lines 7—7 of FIG. 6 showing two insulative bodies interlocking at their respective sides, forming a modular unit as further shown in FIG. 6 and as described herein;

FIG. 18 illustrates one example of a first cantilever-type contact pair from a first connection unit being moved towards mating configuration with a second cantilever-type contact held within a second connection unit, FIG. 19 shows the contacts of FIG. 18 wherein the contacts have achieved electrical communication or union with each other, but are not fully mated;

FIG. 20 illustrates the opposed paired contacts of FIGS. 18–19 in which the contacts have been fully mated to each other;

FIG. 22A is a top view of a retaining device that can be used to precisely place a group of electrical connectors upon a circuit board;

FIG. 22B shows the reverse side of the retaining device shown in FIG. 22A;

FIG. 22C is a partial section and side view of the retaining device of FIGS. 22A–B;

FIG. 22D is a close-up view of a portion of the retaining device as shown in FIG. 22B, which features a rib employed for retaining the electrical connector within the frame of the retaining device;

DETAILED DESCRIPTION OF THE INVENTION

Reference now will be made to the embodiments of the invention, one or more examples of which are set forth below. Each example is provided by way of explanation of the invention, not as a limitation of the invention. In fact, it will be apparent to those skilled in the art that various modifications and variations can be made in this invention without departing from the scope or spirit of the invention.

Figure 1:
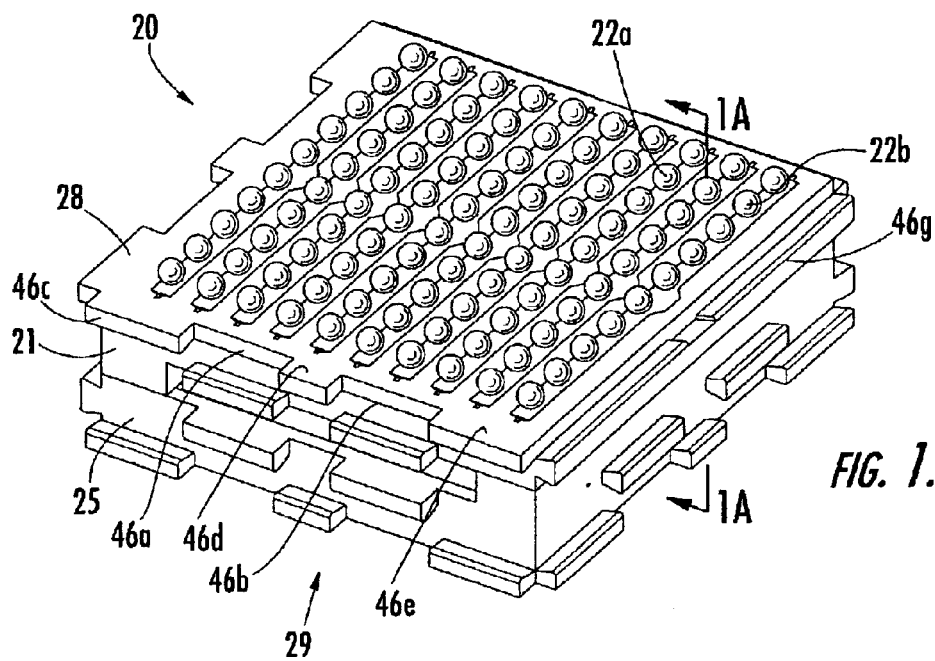
FIG. 1 is a perspective view of a mated electrical connector array of the invention.

Turning to FIG. 1, a connector array 20 is shown comprising a first insulative base 21 positioned in mated configuration with a second insulative base 25. The first insulative base 21 includes numerous solder portions, such as solder portions 22a–b (also known as "solder balls" or "solder nubs") on its first side 28 as shown in FIG. 1. Likewise, the second insulative base 25 contains a plurality of solder portions not shown in FIG. 1, which are located beneath the second insulative base 25 on the second side 29 (see FIG. 1A). Furthermore, both the first and second insulative bases 21, 25 contain a plurality of contacts such as elongated contact 30a (see FIG. 1A section view), each of which may be connected to a respective solder portion 22a–b as in FIG. 1.

Figure 1A:
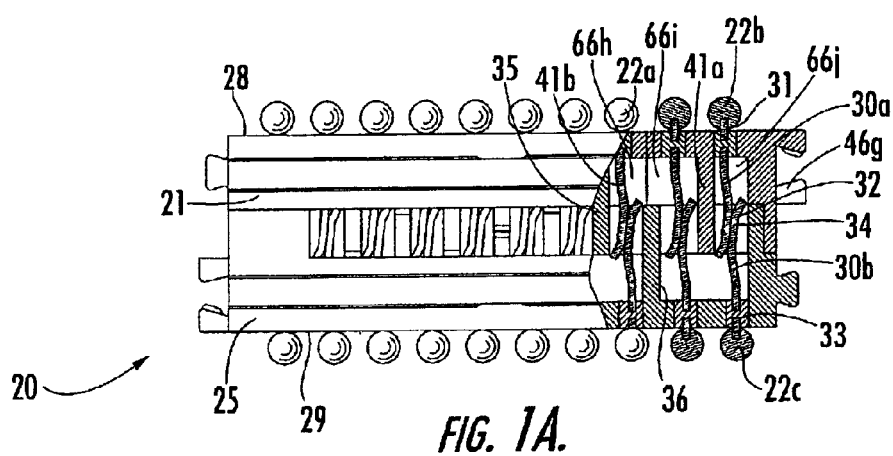
FIG. 1A shows a partially cut-away side view of the electrical connector array taken along lines 1A—1A of FIG. 1.

In FIG. 1A, elongated contacts 30a, 30b, and 41b, for example, are united with respective solder portions; that is, solder portion 22a is fused to contact 41b; solder portion 22b is fused to contact 30a; and contact 30b is fused to solder portion 22c. The plurality of solder portions 22a, 22b on the first side 28 of the first insulative base 21 are electrically connected to a plurality of elongated contacts on the second side 29 of the first insulative base 21. Walls 41a and 35 are shown in FIG. 1A. These walls 41a and 35 separate apertures 66a–j in some applications, and in other locations serve to isolate the mated portion of contacts 30a. (See also FIG. 4A).

Figure 1B:
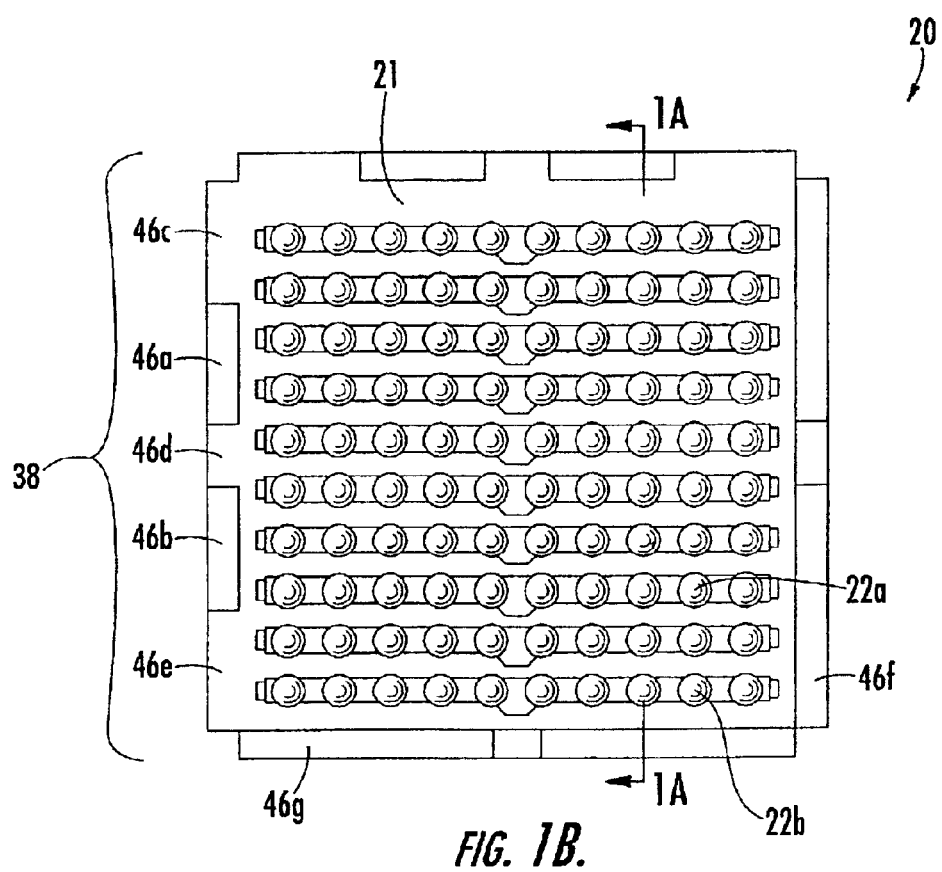
FIG. 1B shows a top view of the electrical connector array of FIG. 1.

Interlocking nubs 46a–e are provided along edge 38, which will be discussed further herein regarding the modular interlocking features of the invention. Interlocking nub 46g is seen in FIG. 1 and FIGS. 1A, 1B as well. The method of operation of these structures is further discussed herein. FIG. 1B shows the top view of features here described. Interlocking nub 46f is seen along the right side of FIG. 1B.

Contact 30a as illustrated in FIG. 1A includes a first end 31 fused to solder portion 22b, and a second end 32 for mating. Contact 30b includes on its first end 33 a solder portion 22c, and its second end 34 mates with second end 32 of contact 30a.

Figure 2:
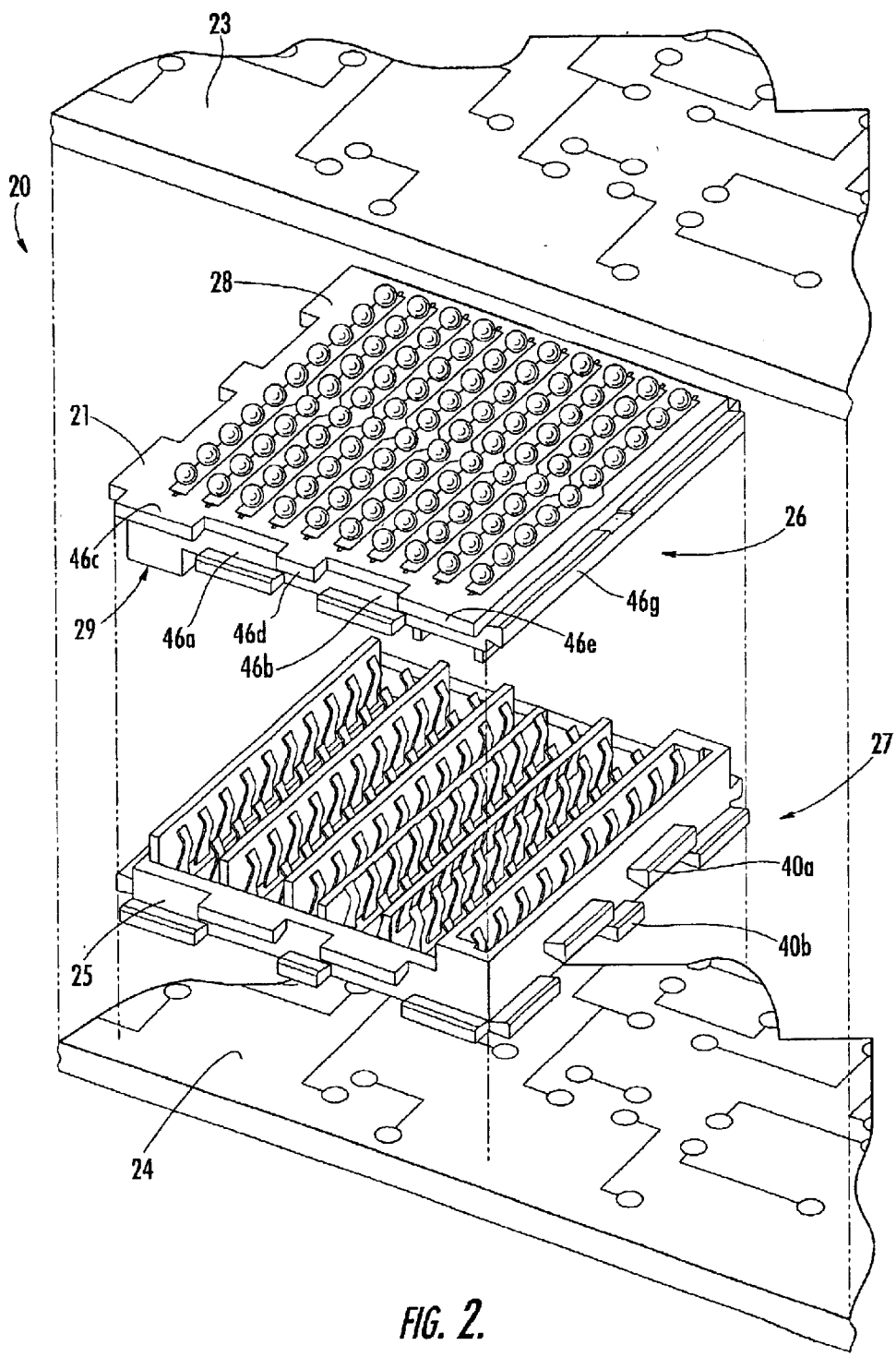
FIG. 2 shows an exploded view of the electrical connector array resting in a mounting position between two circuit boards, with the first connection unit shown near the upper portion of FIG. 2 and the second connection unit in the lower portion of FIG. 2.

In FIG. 2, an exploded view of connector array 20 is shown as a two-part assembly which includes first connection unit 26 and second connection unit 27. The first and second connection units 26–27 are mated, and are positioned between and fused electrically with first circuit board 23 and second circuit board 24, respectively. When mated and applied to circuit boards 23, 24 electrical communication between said circuit boards is effected by connector array 20. Other reference characters and structures in FIG. 2 have been discussed in connection with FIGS. 1 and 1A. Interlocking nubs 40a and 40b project from the second insulative base 25 in the lower right portion of FIG. 2.

Figure 2A:
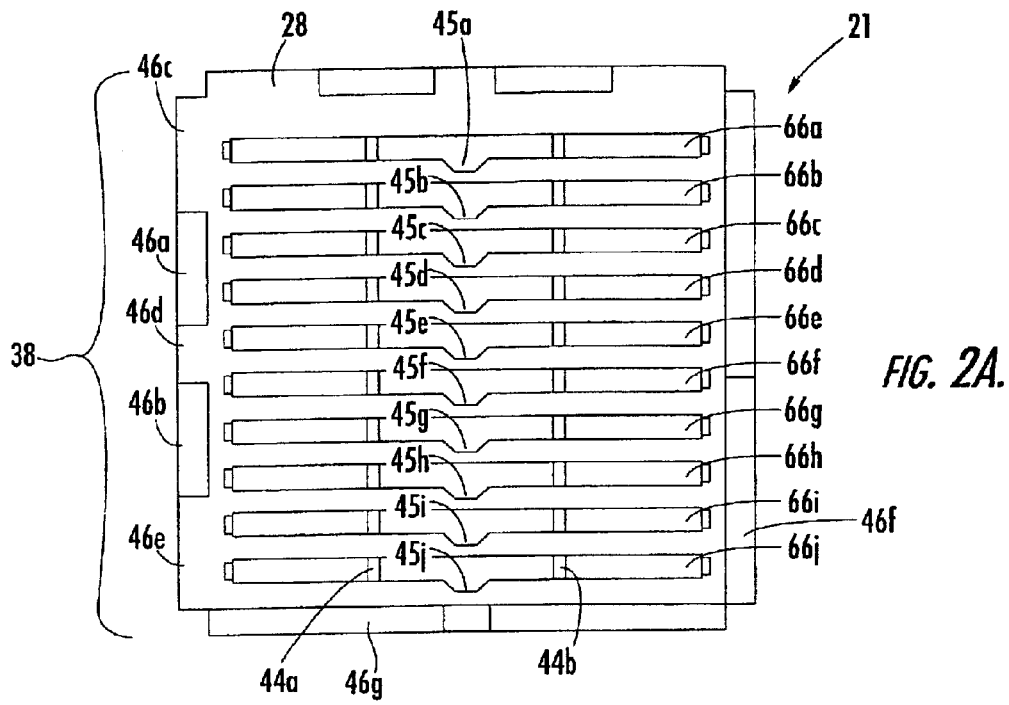
FIG. 2A shows a top view of an insulative body portion of the first connection unit, without contacts or solder portions.

In the practice of the invention, first insulative base 21 is shown in top view in FIG. 2A, without any contacts or solder portions. Numerous parallel apertures are provided in first insulative base 21, including apertures 66a–j, each extending from a point near edge 38 to an opposite side of first insulative base 21 near interlocking nub 46f. A total of ten apertures are seen in FIG. 2A. In other embodiments of the invention, apertures may be of different number or shapes, such as circular, oblong, oval, triangular, or rectangular. There is no limit to the number of contacts that may be provided for insertion into a given aperture 66a. The invention may use apertures of any shape or geometry, and the invention is not limited to those shown and described herein. Apertures may be designed and sized to hold any number of contacts, which may be inserted singly or in contact groups.

A strut member 44a and strut member 44b are shown in FIG. 2A, extending vertically and thus stabilizing first insulative base 21. Registration notches 45a–j register a group of contacts for insertion into apertures 66a–j, respectively. Notches 45a–j are not required in the invention, and some apertures might contain notches, while others may not require them, depending upon the desired contact configuration. Contacts may be registered in their proper location with a cam fit into registration nub 49 (see FIG. 3C) against registration notch 45a when a contact group 55a (see FIGS. 3C and 4A) is inserted into aperture 66a.

Interlocking nubs 46a–g are shown on the periphery of first insulative base 21. Interlocking nubs 46a–e are shown on the left side of first insulative base 41, while interlocking nubs 46f is shown on the right side of the first insulative base 21. Several of such interlocking nubs 46a–g also are seen in side view in FIG. 2C. The function of the interlocking nubs 46a–g is to lock together in "dovetail" fashion more than one insulative base to form larger arrays, in a modular system, as further discussed below in connection with FIG. 7.

Figure 2B:
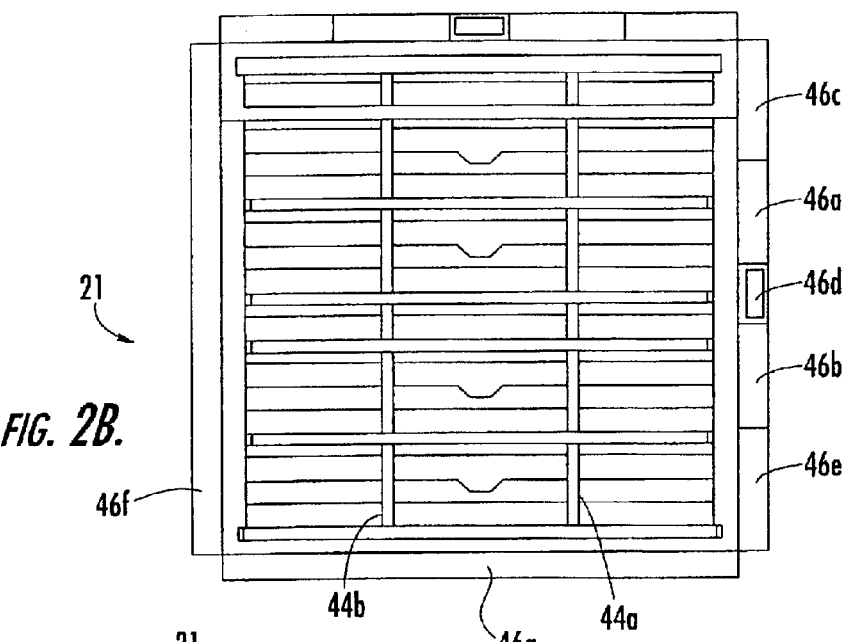
FIG. 2B shows a bottom view of the insulative body shown in FIG. 2A.
Figure 2C:
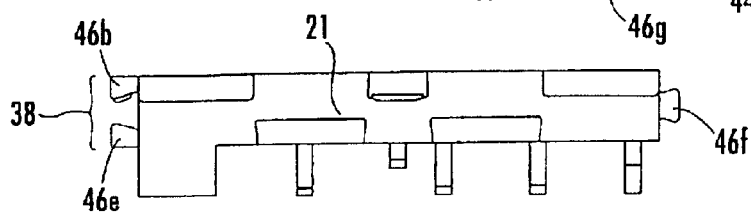
FIG. 2C reveals a side view of the insulative body of FIGS. 2A–2B.

FIG. 2B shows the opposite side of first insulative base 21. In FIG. 2C, an end view of first insulative base 21 is shown.

Figure 3A:
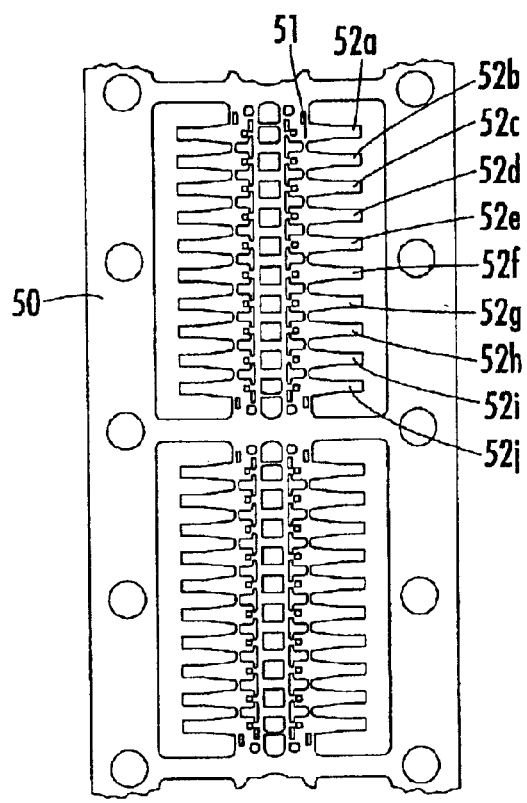
FIG. 3A shows a portion of a stamped carrier strip providing contacts in stamped groups.

FIG. 3A shows a carrier strip 50, illustrating one method and means for manufacturing or stamping contacts in the application of the invention. For example, a contact group 51 has been stamped out of the carrier strip 50, forming a plurality of contacts 52a–h extending from contact group 51. The carrier strip may be very long, and may be coiled for efficient storage until needed in manufacturing operations.

Figure 3B:
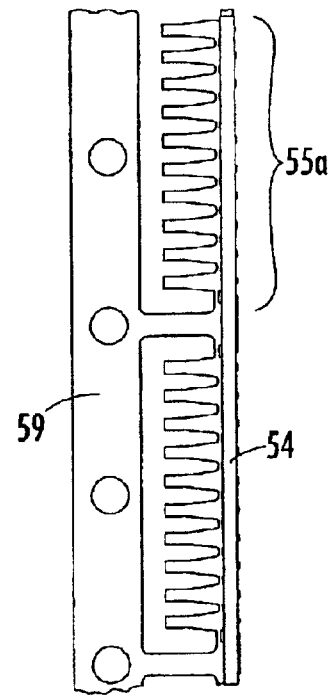
FIG. 3B shows overmolded contact set groups ready for detachment and insertion into insulative bases.

FIG. 3B shows yet another carrier strip 59 having an overmold 54 extending along carrier strip 59, forming an overmolded contact group 55a along molding line 54. Thus, it is possible to employ in the invention contacts of many different varieties, including those which are overmolded, and those which are not overmolded.

An overmold may comprise generally any material that is capable of providing a durable and resilient fit into first insulative base 21. Overmolding may provide a tight and snug fit of an overmolded contact group 55a into insulative base unit 21, increasing retention of the contact group 55a into insulative base 21. Overmolding assists in providing contacts in registration and in precise and correct alignment, which may be beneficial. In some applications, overmolding serves to prevent undesirable wicking (running) of solder down contacts during heating and reflow of solder portions upon contacts, as further discussed herein. Also, overmolding may serve to assist in electrically isolating contacts from each other.

Overmolding materials may be comprised of liquid crystal polymer ("LCP"), thermoplastics, thermoset resins, or other polymeric materials. Several products can be employed, including but not limited to, for example, Zenite®, manufactured by DuPont Corporation, and Vectra®, distributed by the Ticona Corporation.

Figure 3C:
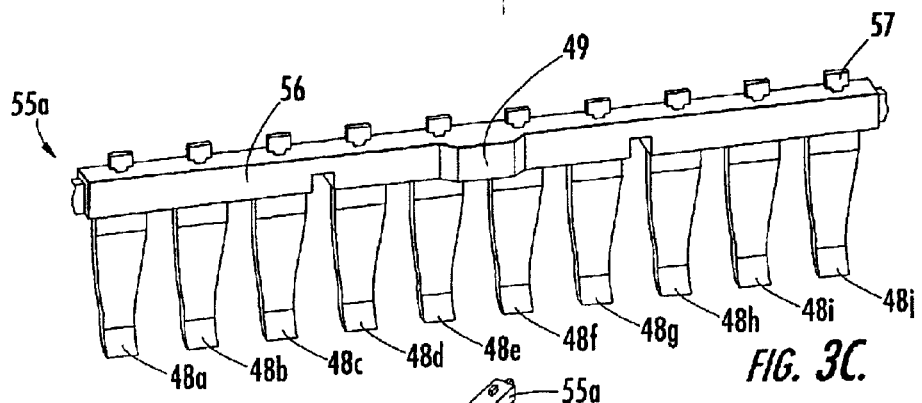
FIG. 3C illustrates in perspective view a contact set group of FIG. 3B which has been removed from the carrier strip.
Figure 4A:
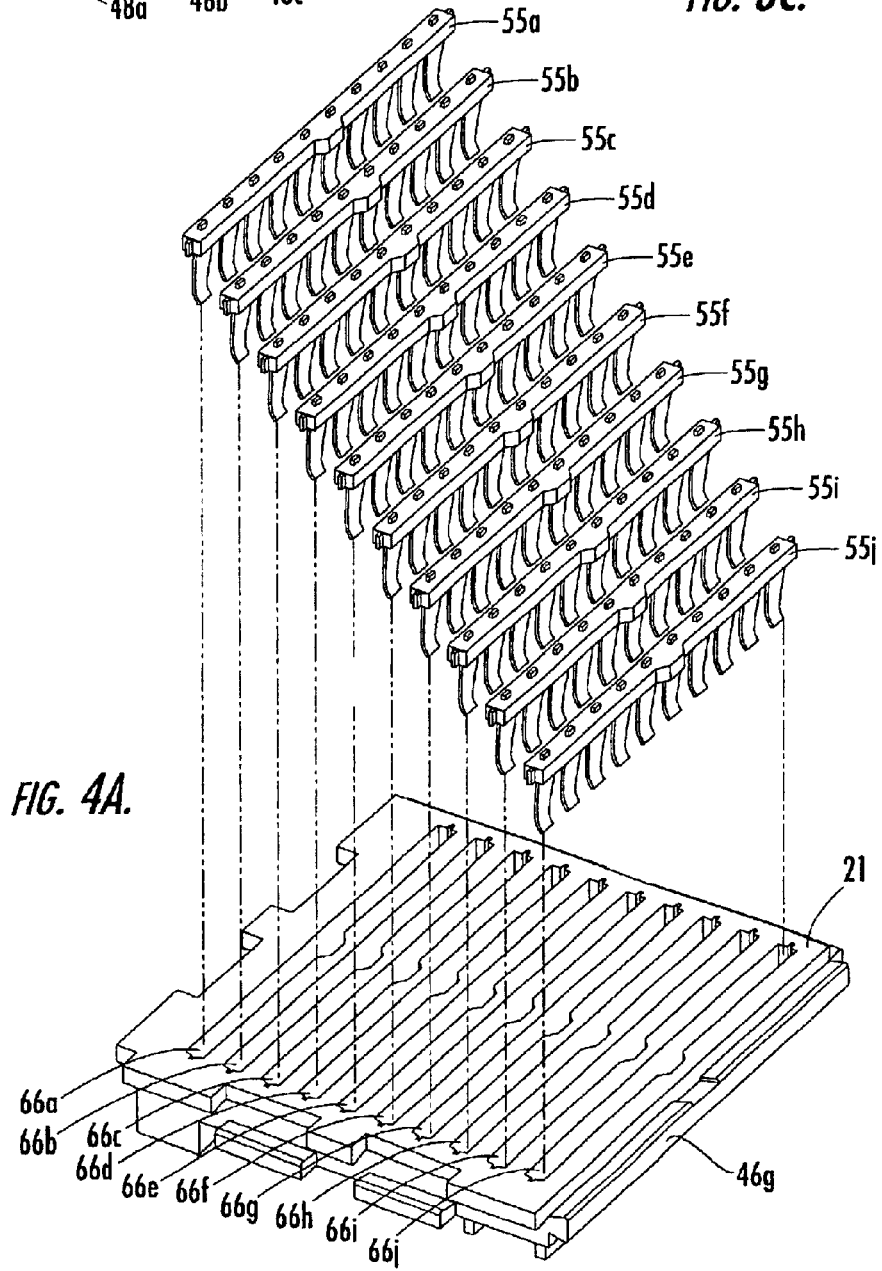
FIG. 4A illustrates in perspective view insertion of a plurality of overmolded contact set groups into a first insulative base.

One example of an overmolded contact group 55a that may be employed in the invention is seen in FIG. 3C. Polymer molding 56 extends to connect multiple contacts 48a–j as shown in FIG. 3C. A registration nub 49 extends from polymer molding 56, the registration nub 49 being adapted for relatively precise registration of the overmolded contact group 55a within a first insulative base 21 as shown in FIG. 4A. A first end 57 of contact 48j is shown in FIG. 3C, the first end 57 being the location at which a solder portion is provided in the manufacturing operation, as further discussed herein.

Figure 4B:
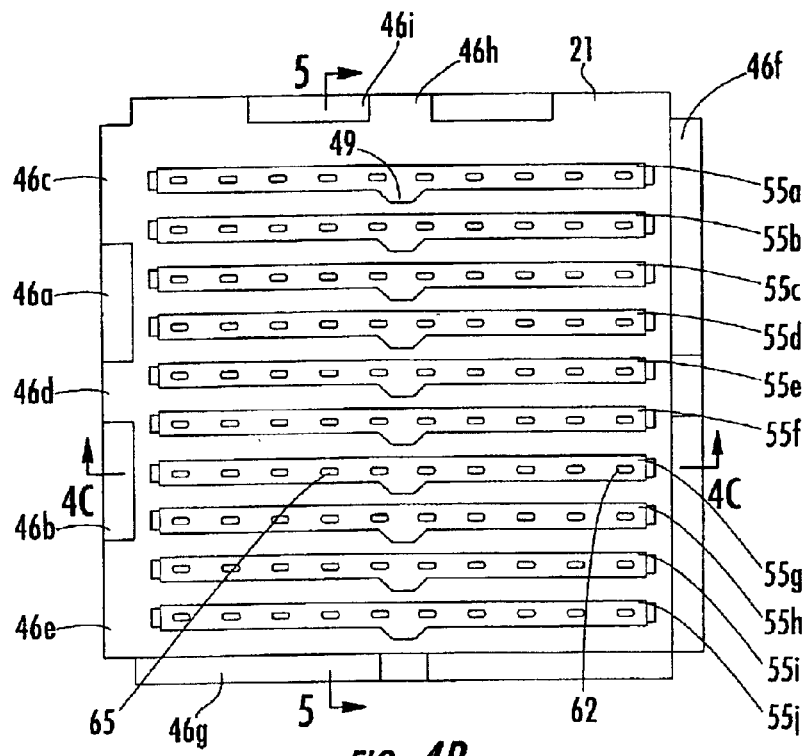
FIG. 4B is a top view of an insulative base with contacts inserted into respective apertures.

FIG. 4A shows a first insulative base 21 receiving overmolded contact groups 55a–j into respective apertures 66a–j of the base. FIG. 4B shows a top view of the first insulative base 21 with overmolded contact groups 55a–j inserted. Furthermore, contacts 62 and 65 are seen in FIGS. 4B–5, respectively. Interlocking nubs 46a–g project from the periphery of first insulative base 21 in FIG. 4B.

After contact groups 55a–j, with or without overmold, are inserted into first insulative base 21 (see FIG. 4A), the contacts are cropped. That is, a mechanical punch or similar device (not illustrated) may shear any metal portions remaining between individual contacts of contact groups 55a–j. This cropping process electrically isolates contacts from each other. Cropping also in some instances may occur before the contacts are inserted into the insulated base, depending upon the particular manufacturing sequence employed.

Figure 4C:
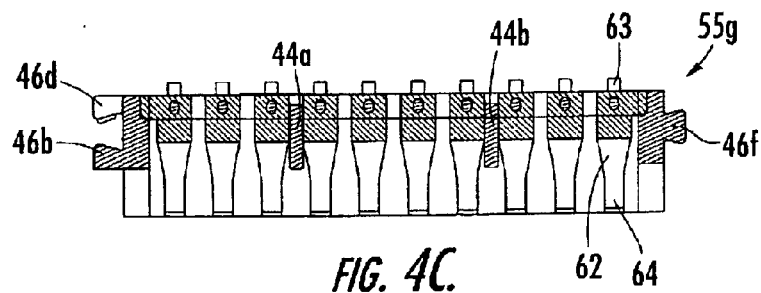
FIG. 4C is a cross-sectional view of the first insulative base with contacts inserted, taken along lines 4C—4C seen in FIG. 4B.
Figure 5:
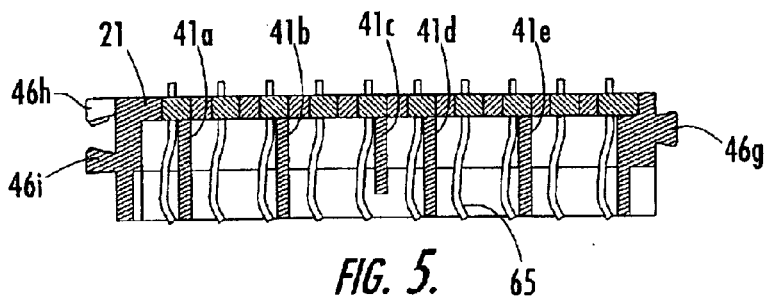
FIG. 5 represents a cross-sectional view of the structure in FIG. 4B, shown along lines 5—5 of the insulative base with contacts inserted.

In FIG. 4C, a first end 63 of contact 62 is ready for mating with a solder portion or solder ball (not shown in FIGS. 4B–5). A second end 64 of the contact 62 is adapted to form an electrical conductive pathway when the connector is mated against an identical or mirror-image counterpart unit. The cross-section in FIG. 4C is taken along lines 4C—4C, through the center of the contact group 55g. FIG. 5 shows a cross-sectional view taken through contact 65. Furthermore, interlocking nubs 46h, 46j, and 46g are seen on the respective sides of first insulative base 21.

FIG. 6 shows a 200-position connection unit 90 that is formed by union of first insulative base 21 with a mirror image or interchangeable insulative base 87. The connection unit 90 is formed by interlocking nubs 88a–d, shown near the center of FIG. 6. FIG. 7 shows a cross-section taken along line 7—7 of FIG. 6, in which interlocking nub 88a and 88d close upon interlocking nub 46g to form a dovetail joint 92. Thus, insulative base 87 is connected at its side with first insulative base 21 to form a larger, modular array. Interlocking may be accomplished by sliding interlocking nub 46g along and between interlocking nubs 88a–d, such that one corner is first formed into a dovetail joint 92, and then interlocking nub 46g slides in-between interlocking nubs 86a–d so that an entire side is formed into a dovetail joint 92. Alternately, another means for interlocking is provided by placing interlocking nub 46g against interlocking nubs 88a–d along essentially the entire length of insulative bases 21 and 87. Then, first insulative base 21 may be forced against insulative base 87, so that interlocking nub 46g is pressed or "snapped" along its length between interlocking nubs 88a–d. This press fit or snap assembly may be particularly effective when materials are used in forming first insulative base 21, insulative base 87, or both, that comprise flexible polymeric material that is capable of bending or deforming under force, and then resuming an original shape once force is removed, to form dovetail joint 92.

Figure 8:
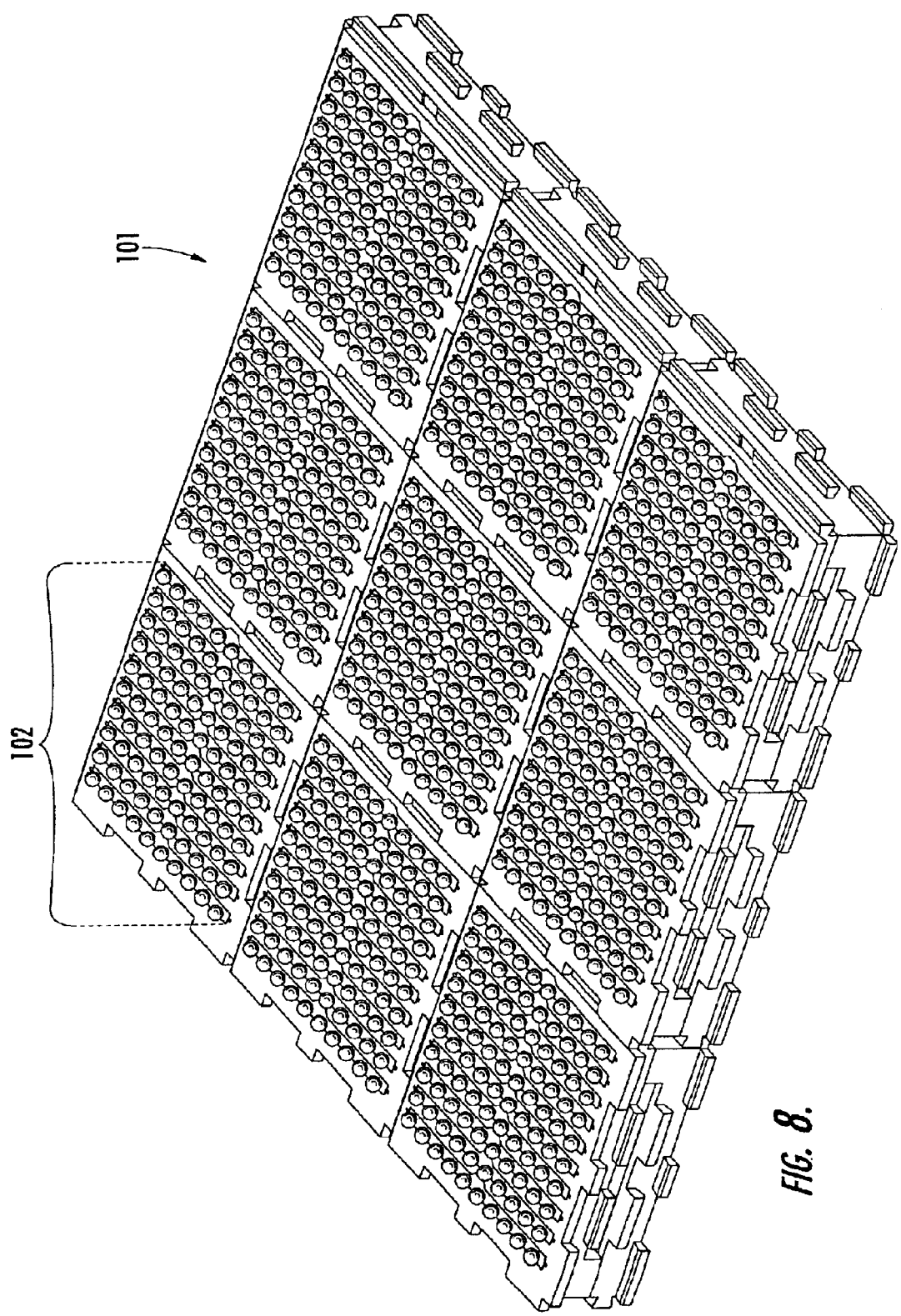
FIG. 8 illustrates yet another embodiment of the invention comprising a mated nine-unit array.

FIG. 8 shows a 900-contact array 101, in which nine insulative base units have been connected together, interlocked at respective sides, and mated with opposing units. There is no limit to the number of contacts that may be provided in a given array, or in an expanded array. Each connection unit could be manufactured in a contact grid other than the 10×10 contact grid 102 shown for each. For example, grids having the following contact arrangements could be constructed: 4×4, 6×6, 8×8, 12×12 or others. Also it would be possible to build grids which are rectangular as in 4×6, 6×12, and the like, without limitation. Numerous combinations are available and could be applied.

Figure 9:
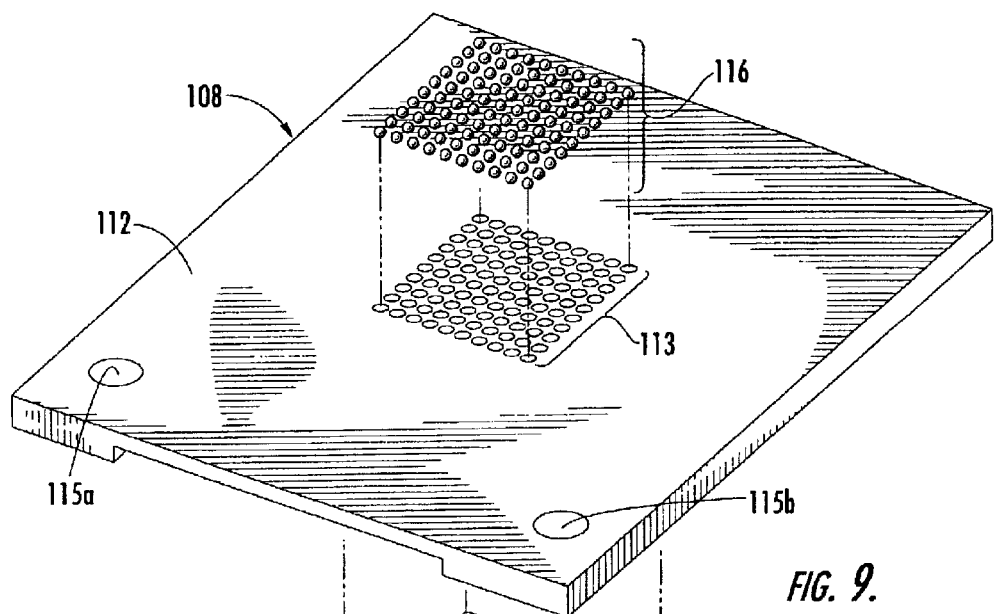
FIG. 9 shows an exploded view of a solder positioning device prepared for placement upon a first insulative base to position for fusion a solder ball array within cavities of the solder positioning device.

FIGS. 9–17 illustrate various manufacturing techniques that may be employed to construct connector arrays 20 of the invention. First, in FIG. 9, an exploded view of a solder positioning device 112 (sometimes called a "stencil") is shown. However, the invention is not limited to that structure shown in FIGS. 9–10, and other means for bringing solder into proximity of contacts can be employed within the scope and spirit of this invention. Solder positioning device 112 may be positioned upon top plane 110 of the first side 28 of first insulative base 21. Apertures on the top plane 110 of the first insulative base 21, are shown filled by overmolded contact groups such as 55j. A bottom plane 111 is shown in FIG. 9. Overmolded contact group 55j is positioned near the middle of FIG. 10.

An array of cavities 113 are provided on the surface of solder positioning device 112, extending through to the underside 117. Alignment slots 115a–b assist in registration and positioning of the solder positioning device 112, with respect to a first insulative base 21. A solder portion array 116 (shown in exploded view) is deposited upon the upper surface 108 of the solder positioning device 112. The solder portion array 116 comprises numerous portions, balls, powder, or pastes of solder that fit into respective cavities 113.

Figure 10:
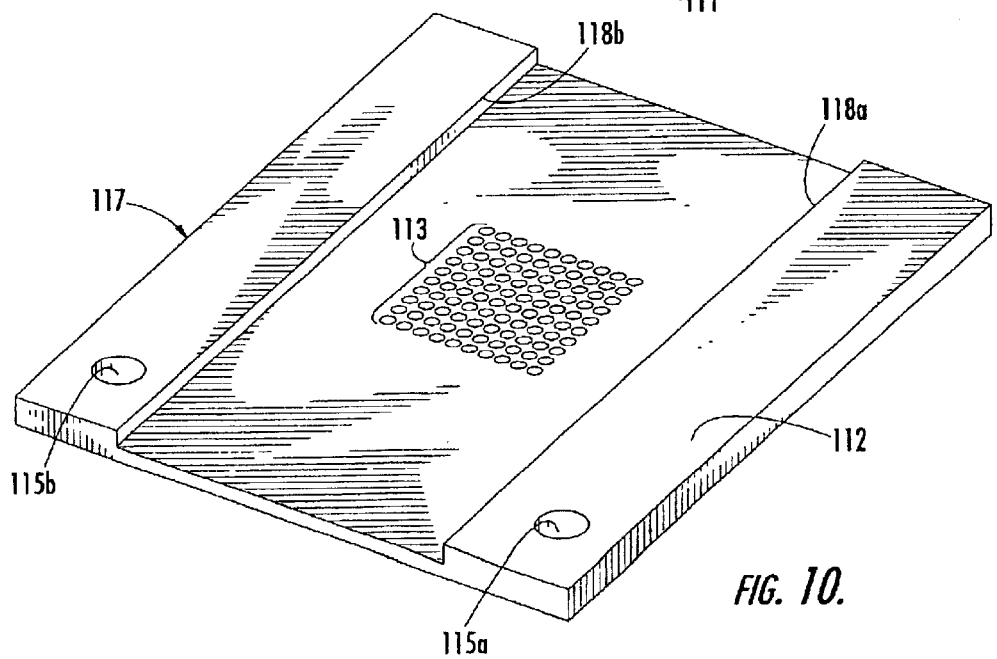
FIG. 10 shows the underside of the solder positioning device of FIG. 9.

FIG. 10 shows underside 117 of solder positioning device 112. The underside 117 provides alignment ledges 118a–b. Alignment ledges 118a–b may be in any number or any arrangement, but in the specific embodiment shown in FIG. 10 there are two ledges which are spaced, and generally parallel to each other, on either side of the cavities 113. One or more alignment ledges 118a–b may be placed at a specific and predetermined distance from the cavities 113 so that alignment ledges 118a–b may be used to register cavities 113 exactly on top of and in communication with the respective apertures 66a–j (FIG. 2A) in communication with contacts of the first insulative body 21.

Figure 11:
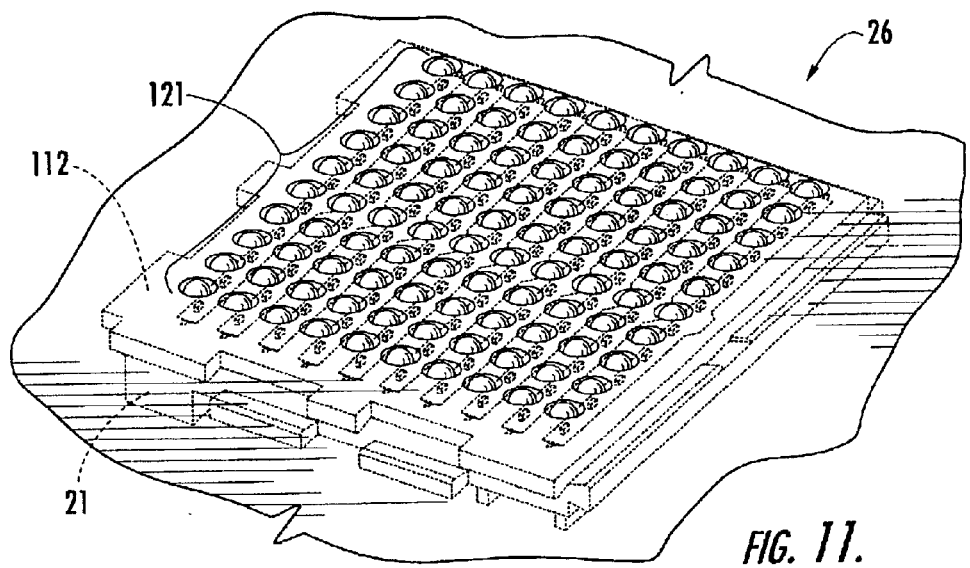
FIG. 11 illustrates a close-up perspective view of a solder positioning device with solder portions inserted into cavities fitted upon the top planar flat surface of a first insulative base.
Figure 12:
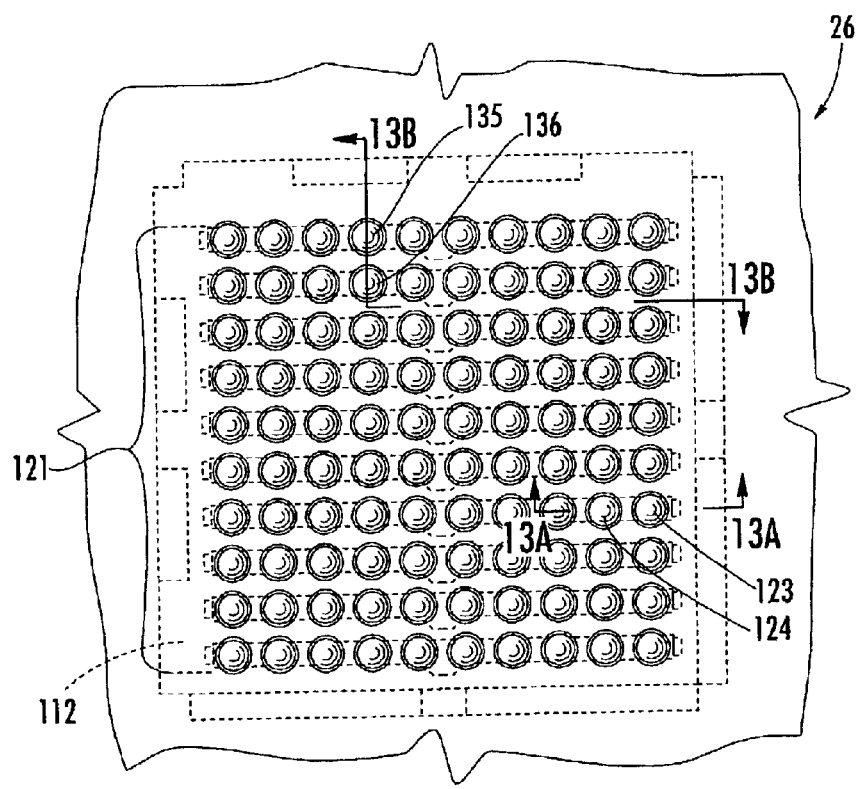
FIG. 12 reveals a close-up top view of the solder positioning device with dotted lines showing the position of an insulative base beneath the solder positioning device.

FIG. 11 reveals a perspective close-up of solder positioning device 112 positioned over the first insulative body 21 to form first connection unit 26. Solder portions from solder portion array 116 enter cavities 113 to form loaded cavities 121, seen also in FIG. 12. FIG. 12 illustrates a top view of first connection unit 26, with solder portion array 116 inserted into cavities 113, including specifically, solder portion 123 and solder portion 124, in the lower right portion of FIG. 12. Furthermore, solder portion 135 and solder portion 136 are seen in FIG. 12.

Figure 13A:
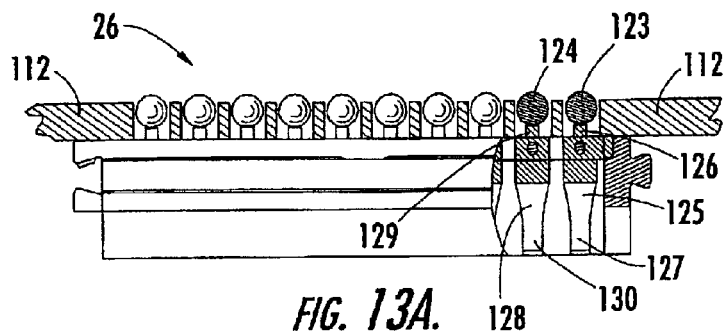
FIG. 13A is a partial cross-sectional view of the assembly of FIG. 12, with a solder positioning device overlying an insulative base, taken along lines 13A—13A of FIG. 12, prior to fusion of solder portions with respective contact elements.

FIG. 13A is a side partial sectional view along section lines 13A—13A (see FIG. 12) of first connection unit 26 of FIG. 10, as it appears prior to heating and fusing the solder portion array 116. Solder portions 123–124 are shown in partial section view, as illustrative examples. In FIG. 13A, prior to heating, contact 125 includes a first end 126 adjacent to solder portion 123, and a second end 127. The contact 128 is shown having first end 129 adjacent solder portion 124, and second end 130. Solder positioning device 112 holds solder portions 123 and 124 in place for reflow to first end 126 and first end 129, respectively. Heat is applied as further described herein, to temperatures ranging from about 180° C. to about 260° C. or more, depending upon the characteristics of the specific solder employed.

Figure 13B:
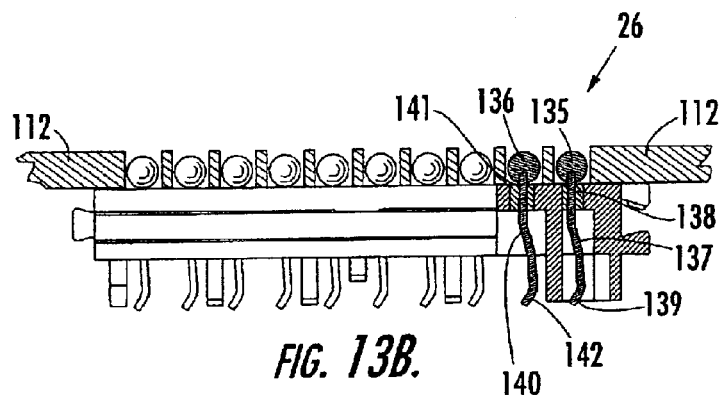
FIG. 13B shows a partial cross-sectional view of the assembly of FIG. 12, taken along lines 13B—13B shown in FIG. 12, after solder portions have been heat fused to contacts.

In FIG. 13B, first connection unit 26 is shown after heating and reflow of fused solder portion 135 and fused solder portion 136 upon contact 137 and contact 140, respectively. Contact 137 includes a first end 138 fused with solder portion 135. Second end 139 is held erect for mating. Contact 140 contains a first end 141 fused to solder portion 136. A second end 142 of contact 140 is poised for mating.

Figure 14:
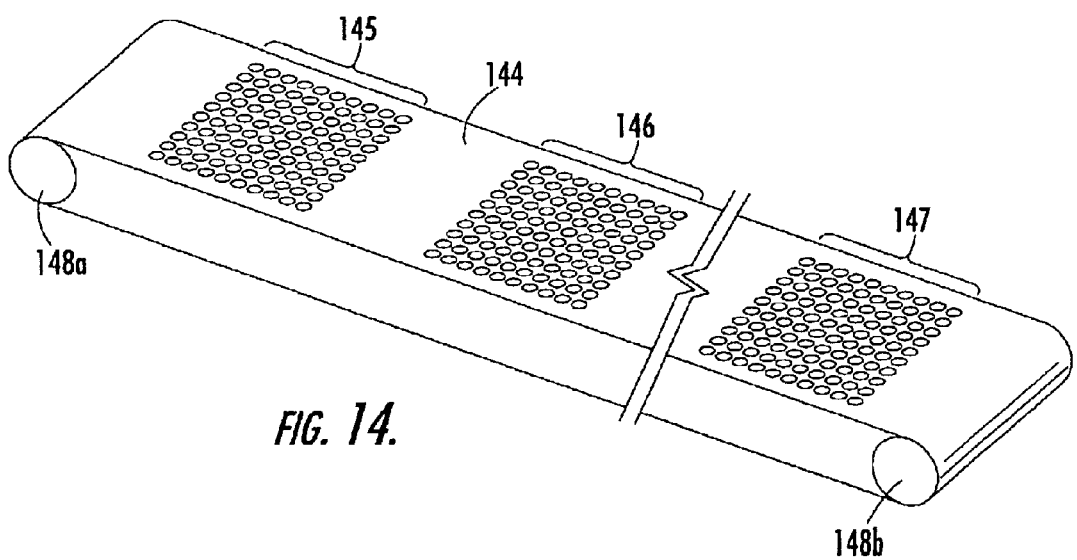
FIG. 14 illustrates an alternate embodiment of the invention in which a continuous solder positioning belt or loop having multiple cavity arrays is employed.

FIG. 14 illustrates in perspective view one apparatus that can be used for high speed manufacturing processes. In such high speed or continuous processes, a solder positioning belt 144 may be used instead of solder positioning device 112 for holding respective solder portions against their respective contacts. Solder positioning belt 144 is fitted with cavity arrays 145, 146 and 147. There is no limit to the number of cavity arrays 145–147 that can be provided upon solder positioning belt 144. In this particular embodiment, three cavity arrays 145–147 are shown for illustrative purposes. Wheels 148a–b are provided for turning and/or rotating solder positioning belt 144 in a continuous process. Solder positioning belt 144 may be applied as shown in FIG. 15, as one example.

Other applications could employ an intermittent belt, a carousel, or any type of "bed" capable of holding and locating solder portions.

Figure 15:
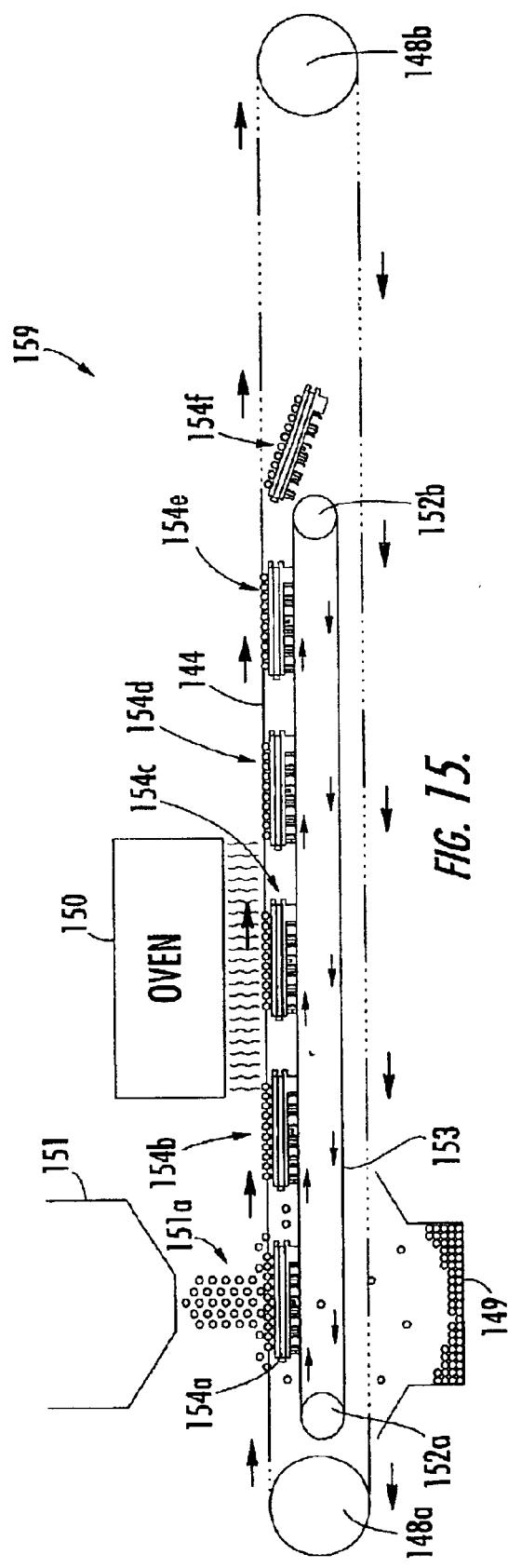
FIG. 15 illustrates an automated process for employing the solder positioning belt of FIG. 14 to manufacture electrical connector units.

In FIG. 15, automated process 159 is shown. Electrical connection units 154a–f are shown in FIG. 15 proceeding from the left to the right side of the Figure, in continuous fashion. Drive wheels 152a–b rotate conveyor 153 in clockwise fashion. This motion moves electrical connection unit's 154a–f along the manufacturing line, in which solder is positioned and then heated for reflow upon contacts. Electrical connection unit 154a is shown receiving from solder dispenser 151 an array 151a of solder portions. Once the array 151a is loaded, then electrical connection units proceed through heating oven 150, as shown for example by electrical connection unit 154c. While in the oven 150 of the automated process 159 the solder arrays 151a–f are respectively fused to contacts (contacts not visible in FIG. 13). A completed electrical connection unit 154f is shown advancing beyond the conveyor 153. Solder positioning belt 144 rotates clockwise as shown in FIG. 15 and in synchronous time with conveyor 153. Fresh cavity arrays (such as cavity array 145 of FIG. 14) are presented to mate with assembled electrical connection units (such as electrical connection unit 154a) at solder dispenser 151. In other applications, a solder paste may be applied or wiped upon solder positioning belt 144, rather than using particles of solder as shown in FIG. 15. Thus, a solder paste can be wiped over cavity arrays 145–147, thereby "loading" the respective cavities with solder paste. Furthermore, solder portions from solder array 151a in excess of that needed to fill up a given array on electrical connection unit 154a may drop into a solder collector 149, for later re-use.

Figure 16A:
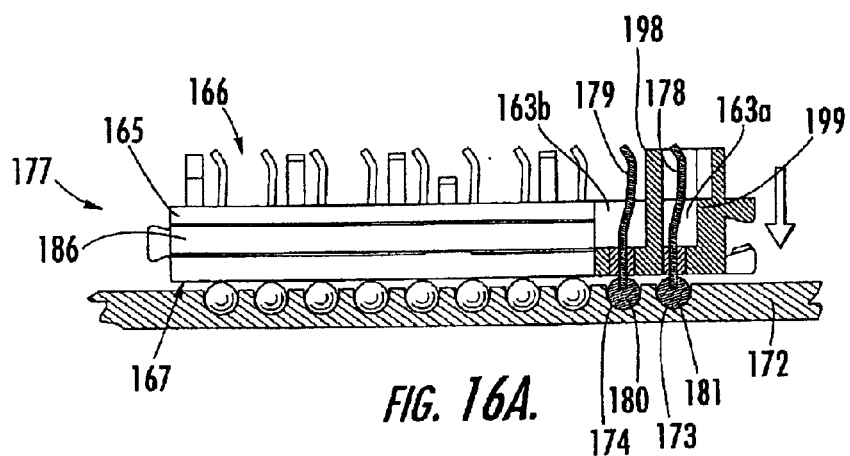
FIG. 16A shows an alternate method of constructing connection units of the invention in which a carrier is employed to position solder against contacts for heat fusion, in which solder portions are loaded into notches of the carrier and applied to ends of contacts.
Figure 16B:
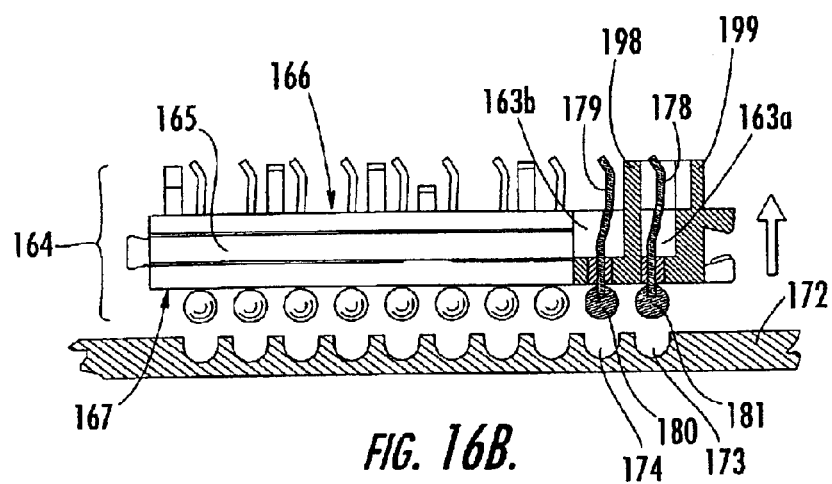
FIG. 16B illustrates displacement or removal of a carrier from an insulative base after fusing solder portions to contacts.

FIG. 16A shows yet another embodiment of the invention, in which solder carrier 172 may be employed to construct first connection unit 164 (see FIG. 16B for completed first connection unit 164). FIGS. 16A–B show several views of a method and apparatus for using carrier 172 to join contacts with respective portions of solder. In FIG. 16A, a first insulative base 165 is shown in a partial cross-section view, with an upper side 166 and a lower side 167. A plurality of apertures extend from the upper side 166 to the lower side 167 (apertures 163a–b as examples, are shown in FIGS. 16A–B). Walls 198–199 electrically isolate contacts 178–179 and provide structural support to first connection unit 164.

Below first insulative base 165 is solder carrier 172. Solder carrier 172 may include numerous open notches on its upper surface, such as for example notch 173 which contains solder portion 181, and notch 174 which contains solder portion 180 (when filled with a solder portion, they are referred to herein as a "loaded notch"). It is possible to have an entire array of notches 173–174 in a grid, such as: 4×4, 6×6, 8×8, 10×10, 12×12, 6×10, 8×12, and the like.

FIG. 16A illustrates a heating position 177 in which a first contact 179 and a second contact 178, for example, are in mating contact with solder portion 180 and solder portion 181, respectively. Once heat is applied and solder is fused, carrier 172 may be removed from first connection unit 164.

FIG. 16B shows a removal position. At the stage shown in FIG. 16B, the insulative base 165 has been heated, and the solder portions 180–181 have been fused to respective contacts 174–173. Now, the carrier 172 may be removed from the first connection unit 164. Lower surface 167 of first insulative base 165 is pulled away from carrier 172, as fusion of the various solder portions 180–181 (and others) has been completed.

Figure 17:
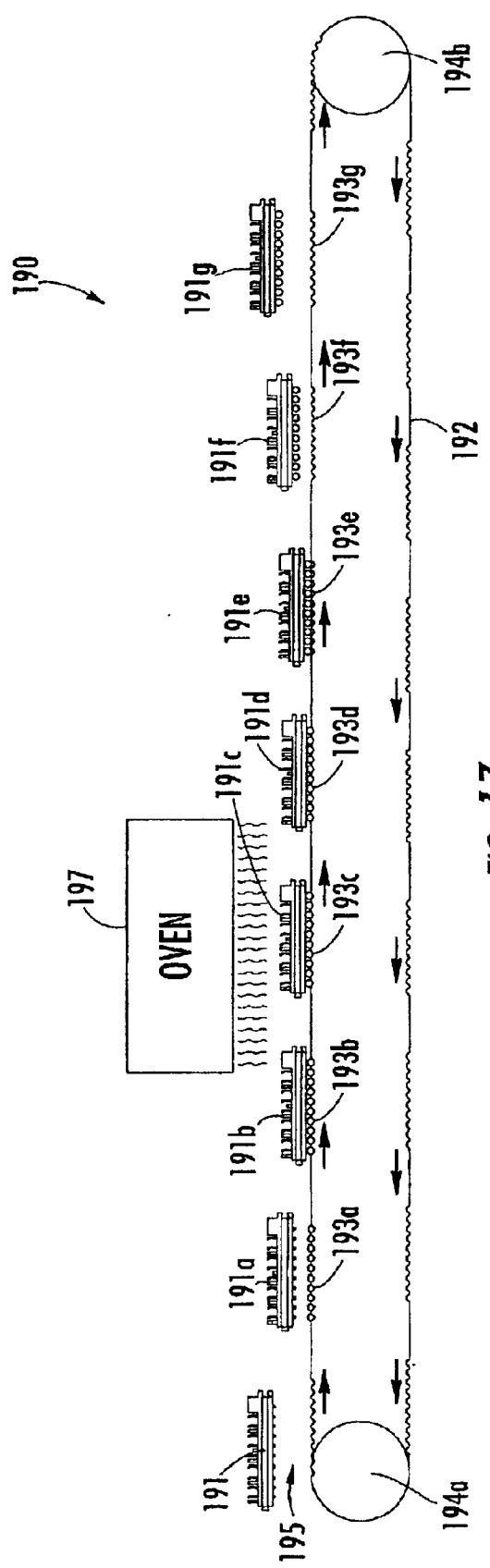
FIG. 17 illustrates a continuous process that may be employed to apply solder portions to insulative bases, thereby forming loaded notches.

FIG. 17 shows an alternate embodiment of a method and apparatus for manufacturing. Automated process 190 is employed to construct electrical connection unit's 191a–g using carrier templates 193a–g as shown. In the continuous manufacturing process shown in FIG. 17, a solder positioning carrier belt 192 may rotate (i.e.: clockwise in FIG. 17) around wheels 194a–b. Furthermore, solder application area 195 provides solder upon first connection unit 191. The solder applied may be in the form of spherical balls, particles, granules, or even a spreadable solder paste that is applied upon the upper surface of carrier templates 193a–g as the respective carrier templates 193a–g move by solder application area 195. The process may form a plurality of "loaded" notches, which are then heated in oven 197. Various types of solder may be employed in different consistencies or geometric arrangements, liquid or solid, to provide an efficient and effective means for installing solder into carrier templates 193a–g to form such loaded notches. Of course, continuous processes could be employed using means or apparatus other than those shown in FIG. 17, and such processes also are within the scope and spirit of the invention.

FIG. 18 shows one embodiment of the invention in which contacts 30a and 30b of FIG. 1A are isolated from connector array 20 to show their configuration. Contacts 30a–b, when mated, move together in a biased pair to form an electrical conductive union.

Contact 30a provides a first cantilever extension 251 opposite a second cantilever extension 252 of contact 30b. A first solder portion 22b is connected to the first end 31 of the first cantilever extension 251. Likewise, a second solder portion 22c is connected to the first end 33 of the second cantilever extension 252. An optional overmold 255, and overmold 256 also may be employed. The invention may be practiced without overmolding, as it is an optional feature. First cantilever extension 251 contains first bend 257, and a first curved portion 263 lying generally between the first bend 257 and second bend 265. Beyond second bend 265 is a mating portion 267. The mating portion 267 extends to the second end 32 of the first cantilever extension 251. Likewise, second cantilever extension 252 comprises a first bend 258, beyond which lies a second cantilever extension 252. A second curved portion 264 lies between the first bend 258 and a second bend 256. Beyond the second bend 256 lies a mating portion 268. A second end 34 of the second cantilever extension 252 is shown. The respective mating portions 117, 118 may be generally straight, as shown in FIGS. 18–20, or in other applications may be curved, depending upon the force deflection required, and contact configuration of the particular connection system.

FIG. 19 shows contacts 30a–b, in which the first cantilever extension 251 and second cantilever extension 252 have been moved together, and are in resilient contact with each other as would occur when the first insulative base 21 and the second insulative base 25 (see FIG. 1A) are brought together in a mating configuration to form connector array 20. FIG. 19 illustrates mating portion 267 and the respective mating portions 267, 268 being brought together, causing deflection of both the first cantilever extension 251 and second cantilever extension 252. As shown in FIG. 19 first cantilever extension 251 is deflected towards the left as shown in FIG. 19. The second cantilever extension 252 is deflected towards the right, as shown in FIG. 19. Dotted lines show undeflected positions.

In FIG. 20, contacts 30a–b are illustrated in a successive view in which the first cantilever extension 251 and second cantilever extension 252 have been brought together in a full mating configuration, with overlap 270 providing electrical conductivity between contact 30a and contact 30b. In some cases it is preferable to have an overlap of at least about 20% of the overall length of the first contact 30a, but lesser or greater amounts of overlap can be employed, depending upon the particular application.

Figure 21A:
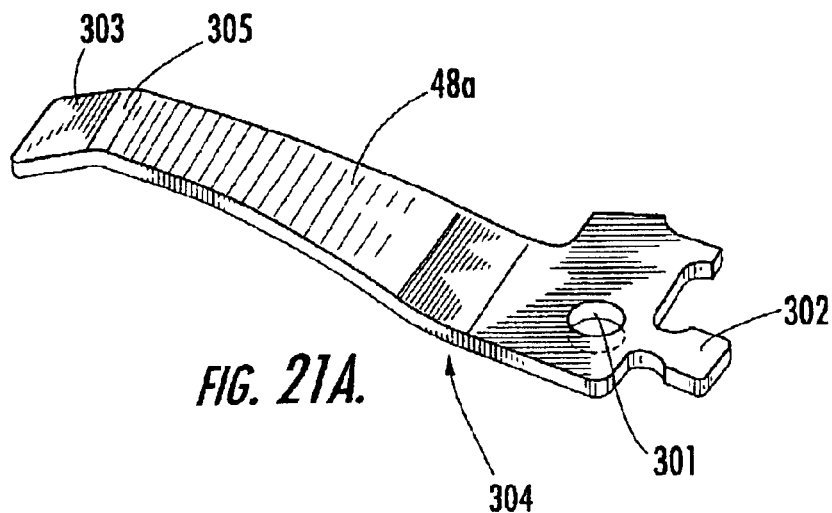
FIG. 21A illustrates a perspective view of one configuration of a contact previously shown in FIG. 3C, which has been cropped, but without overmolding.

FIG. 21A is a perspective view of one configuration of contact 48a, previously illustrated as part of overmolded contact group 55a in FIG. 3C. In FIG. 21A, the contact 48a is displayed without optional overmolding, revealing the geometric shape of the metallic portion which includes aperture 301, first end 302 and second end 303. First bend 304 and second bend 305 are illustrated as well.

Figure 21B:
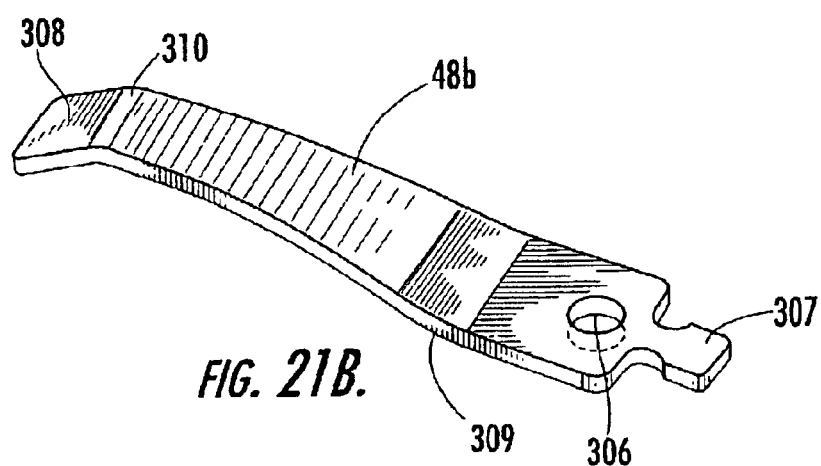
FIG. 21B shows another contact.

FIG. 21B illustrates contact 48b (without overmolding) which is part of the contact group 55a previously seen in FIG. 3C. An aperture 306 retains overmolding to contact 48a (overmolding not shown). First end 307 and second end 308 form the terminal portions of the contact 48b, while first bend 309 and second bend 310 are illustrated. In other applications of the invention, more or less than two total bends per contact may be employed, depending upon the displacement requirements and force required to maintain a resilient and satisfactory union.

Figure 21C:
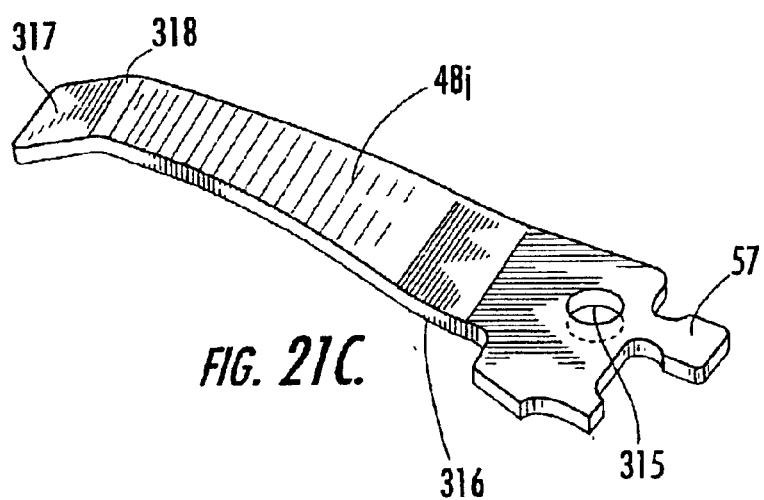
FIG. 21C illustrates yet another contact.

FIG. 21C shows contact 48j (previously seen in FIG. 3C). A first end 57 is adapted for fusion with a solder ball or solder portion (not shown). Aperture 315 appears just beyond the first end 57. Second end 317 is seen as well. First bend 316 and second bend 318 also are illustrated.

FIGS. 21A–21C do not include overmolding upon the contacts, for clarity of illustration. Overmolding of contacts is an optional feature, and is not always employed with contacts of the invention.

As it has become more important to produce smaller electrical components, the tolerance of deflection of contacts within electrical components is increasingly an important issue. That is, manufacturing tolerances sometimes require a deflection of a contact of between about 0.020 inches and 0.030 inches, plus or minus 0.002 inches tolerance. This may be provided for components with only about 10% of displacement travel from fully deflected to non-deflected. As engineering requirements demand smaller components, the travel distance or deflection of a contact may be only about 0.002 inches, which is ten times less deflection than 0.020 inches. Furthermore, if a stamping tolerance of +/–0.002 inches represents the entire amount of contact travel that may be permitted, then use of the invention may be particularly advantageous. One reason for this advantage in comparison to other apparatus is that by employing the invention with opposed mating contacts, both of which are deflected, there may be a reduction in the total width required within the housing for deflection. This results in the opportunity to manufacture smaller connector arrays 20.

There is no limit to the number of contacts that may be provided in a given array, or in an expanded modular array. Each connection unit could be manufactured in a grid other than the 10×10 grid shown. For example, grids of the following could, as examples, be constructed: 4×4, 6×6, 8×8, 12×12 or others. Also, it is possible to build grids which are rectangular as in 4×6, 6×12, and the like, without limitation. Numerous combinations are available and could be employed.

Preferably, connector arrays 20 should be substantially co-planar. There are relatively strict tolerances for co-planarity. One factor influencing co-planarity of a substrate mounting face is the uniformity in size of solder portions (or solder balls) and the position of solder with respect to the circuit board mounting face.

During manufacture, the "wicking" or running of melted solder along the length of contacts may have undesirable consequences in part because it may reduce the amount of the solder ball fusible body that is available for bonding upon a circuit board, and therefore may undesirably affect co-planarity of an array. Undesirable and unexpected reduction in the solder ball mass may cause co-planarity problems.

In some applications the wicking of reflowed solder may be minimized by the employment of overmolding upon the contacts. Overmolded portions upon contact groups 55a–j may be designed to fit tightly into a first insulative base 21, which may reduce the tendency of the solder to travel down the length of a contact upon reflow and melting of the solder. In some applications, it is desirable to provide contacts for insertion into the first insulative base in grouped stamped units, which are not overmolded, but are held in place by other retention means known in the art.

In the practice of the invention, various solder portions may be used having a variety of different geometric shapes. However, one embodiment that has proved effective is the use of spherical solder balls, such as those made and distributed by the Indium Corporation of America, 1676 Lincoln Avenue, Utica, N.Y. 13502. For example, spherical solder balls are available in various alloys, including for example Indium Corporation's part number 42141, which has an alloy comprising about 63% Sn (tin), and about 37% lead (Pb).

In other applications, the amount of Sn in the solder may be as high as about 90%, or even greater. In some alloys, the remainder of the alloy may be lead. In other applications of the invention, a lead-free solder which is composed entirely of Sn could be employed. Furthermore, there are other types of solder that may be employed in the practice of the invention. In general, solder should possess a reflow temperature sufficiently low to effect good bonding, but sufficiently high to avoid adversely affecting polymeric insulative body materials.

Solder alloys employed in the invention range between about 80% Pb and 20% Sn; to a ratio of about 10% or less Pb and 90% Sn. One useful alloy composition is about 63% Pb and about 37% Sn, with a melting point of about 183° C. A hard solder ball sometimes is seen to deform slightly as it softens under surface mount technique (SMT) conditions. Often, a soft eutectic ball may be used for attachment of connectors to printed circuit boards, and will usually reflow and reform itself under SMT conditions.

Other solder types that may be employed in the practice of the invention include, without limitation, electronically acceptable tin-antimony, tin-silver, lead-silver alloys, and indium. In some cases, a solder paste or cream may be incorporated or adapted for use in the invention. In some applications, a solder alloy may be employed in the form of a fine powder suspended in a suitable fluxing material.

Heating is preferably conducted in a solder reflow conveyor oven as illustrated in FIGS. 15 and 17 or similar devices. Typically, the solder portion is heated to a temperature from about 181° C. to about 200° C., but depending upon the identity of the material employed in the housing, solders have a melting temperature lower or higher than that specified herein may be used. Some solder alloys are heated to between 230° C. and 260° C., depending upon the specific alloy used. Some solder requires temperatures in excess of 260° C.

In automatic processes, a conveyor oven can be operated so that the total elapsed time of the alloy within an oven is between about 5 and about 10 minutes, although some applications will use less or more time for reflow. Sometimes, prior to being inserted into the conveyor oven, contacts and solder elements are preheated at an elevated temperature, to prepare then for fusion.

Several methods and apparatus are disclosed herein for retaining connectors in position for soldering upon a circuit board or similar electrical structure. In FIG. 22A, a retaining device 400 is shown in top view. The retaining device 400 comprises a frame 401 that facilitates placement of electrical connectors upon a circuit board, as further discussed below. The frame 401 includes first interior wall 402, second interior wall 403, third interior wall 404, and fourth interior wall 405. The respective interior walls 402–405 are placed in perpendicular fashion as shown in FIG. 22A. The first interior wall 402 and third interior wall 404 are shown in phantom, as they are underneath the suction pad 406 shown in the center of FIG. 22A. The purpose and function of the suction pad 406 will be further discussed herein.

First exterior wall 407, second exterior wall 408, third exterior wall 409, and fourth exterior wall 410 together form a four-sided structure that bounds respective interior walls 402–405, forming frame 401. The respective exterior walls 407–410 form an outer perimeter outside the frame 401, while the interior walls 402–405, in connection with their respective exterior walls 407–410, form four windows: 417a, 417b, 417c, and 417d. Each of the respective windows 417a–d is bounded by the inner perimeter of the frame 401. A center point 418 forms the intersection between the interior walls 402–405.

FIG. 22B shows the reverse side of retaining device 400 previously seen in FIG. 22A. In FIG. 22B, the reverse side of the suction pad 406 may be seen, where it connects to center point 418 near the center of FIG. 22B.

FIG. 22C shows a partial section side view of the device shown in FIG. 22B. In FIG. 22C, the fourth interior wall 405 is shown in section view at the top of the Figure, and the lower portion of FIG. 22C the window 417a is illustrated.

Figure 22E:
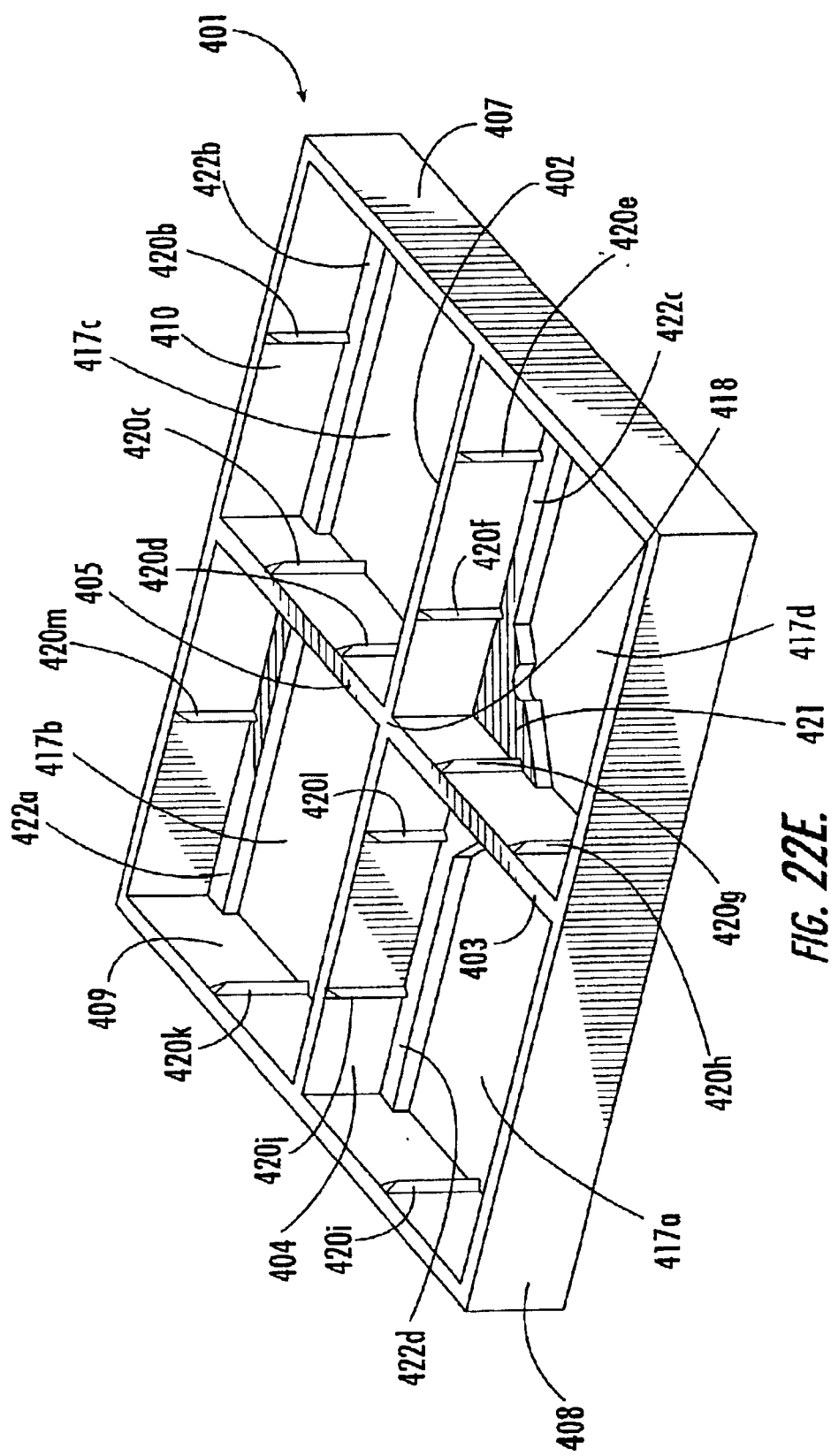
FIG. 22E is a perspective view of the retaining device or frame of FIG. 22B.

FIG. 22D is an expanded view of the portion shown by circle in FIG. 22B. FIG. 22D shows a close-up of one of the many ribs 420a included along the inner perimeter of the frame 401. For clarity, the ribs are not numbered in FIGS. 22A–C, but are shown in detail in FIG. 22E, described below.

FIG. 22E shows a perspective view of the frame 401 of FIG. 22B. A tab 421 extends underneath the center point 418. The tab 421 may serve as a holding mechanism to assist in retaining an electrical connector within the frame 401, as further discussed herein. Similar tabs to that shown as tab 421 may be provided in other windows 417b, 417c, and 417a as well. Tab 421 serves to retain an electrical connector within window 417d, as shown in FIG. 22E. However, it should be noted that tab 421 is an optional feature of the holding mechanism of the frame 401, and it may work in connection with a variety of other types of apparatus and methods for holding an electrical connector in place, including but not limited to the use of ribs, as further discussed below.

A plurality of ribs 420a–m are provided along the inner perimeter of the windows 417a–d of the frame 401. The ribs 420a–m provide for resilient engagement against insulator or side portions of electrical connectors when such electrical connectors are inserted into the windows 417a–d of the frame 401. The ribs 420a–m act to hold the electrical connectors in place, so that if the frame 401 is inverted for mounting upon a circuit board, as will be described below in connection with FIG. 24, the electrical connectors will stay firmly in place within the frame 401 to be heated and soldered to a circuit board, as further described below. That is, ribs 420a–m may be slightly deformed to facilitate this holding function.

In the particular application shown in FIG. 22E, ledges 422a–d are provided to further stabilize an electrical connector squarely within the windows 417a–d when the electrical connectors are placed within such windows 417a–d. The insulative base of electrical connectors may be pressed firmly against the surface of ledges 422a–d, so that the ledges 422a–d, in conjunction with tabs (such as tab 421) and the ribs 420a–m work together to form a holding mechanism that is capable of securely retaining electrical connectors within the frame 401 until such time as the electrical connectors have been firmly soldered to a circuit board or other electrical assembly. Furthermore, the ledges 422a–d also serve to hold electrical connectors in position so that the array of solder balls presented to a circuit board assembly is planar, thereby providing an even and consistent application of solder balls for soldering.

Figure 23:
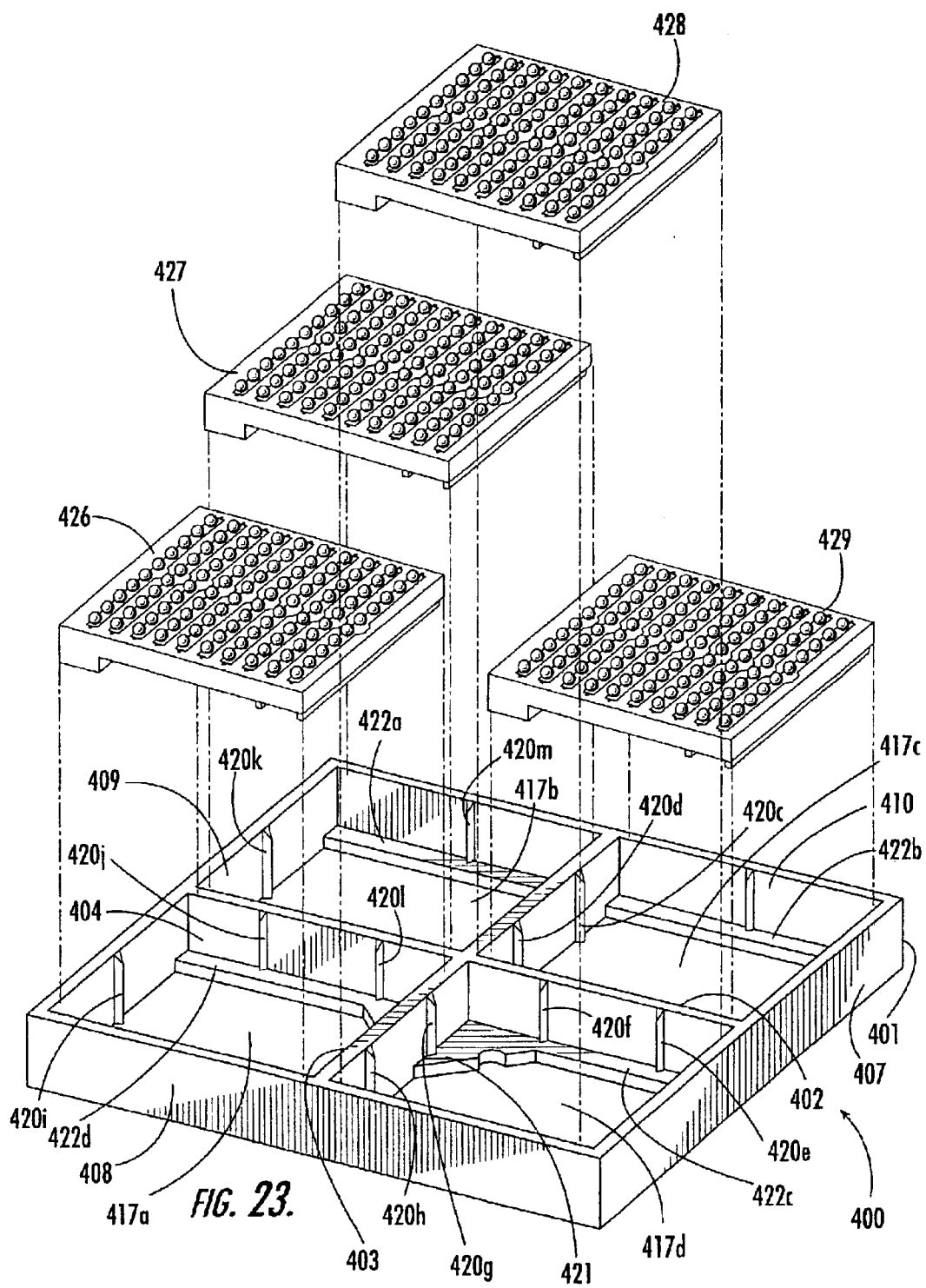
FIG. 23 is an expanded view showing four electrical connectors as fitted into the retaining device of FIG. 22B.

FIG. 23 shows an expanded view including first electrical connector 426, which may be placed into window 417a. Second electrical connector 427 is configured for insertion into window 417b. Third electrical connector 428 likewise is configured for insertion into window 417d, while fourth electrical connector 429 is configured for insertion into window 417c of the frame 401.

Each of the respective windows 417a–d includes at least one rib projecting along the inner perimeter of the interconnected walls. The ribs 420a–m that may be seen in FIG. 23 are adapted for resilient engagement against the respective electrical connectors, 426–429.

The frame 401 shown in FIG. 23 is adapted for holding four electrical connectors 426–429. However, there is no limit to the number of electrical connectors that could be accommodated within a frame 401, and other embodiments that are within the spirit and scope of the invention could include a frame 401 which hold two, three, five, six, or more electrical connectors within a single frame 401.

In FIG. 23, the embodiment shown therein provides several ribs along the inner perimeter of respective windows 417a–d. For example, window 417d includes two ribs upon the interior walls (i.e. first interior wall 402 and second interior wall 403). However, the exterior walls 407–410 shown in the embodiment of FIG. 23 each include only one rib 420. However, other arrangements could be provided with more ribs upon exterior walls, or less ribs upon interior walls, but the arrangement shown in FIG. 23 has proven satisfactory. The tab 421 is oriented generally perpendicular to the interior walls 402, 403 and is positioned to facilitate the retention of electrical connector 428 within the perimeter of walls 402, 403, 408, and 407. It may be seen that each exterior wall 407–410 provides a boundary for two windows, as shown in FIG. 23. For example, first exterior wall 407 forms a boundary for window 417c and window 417d.

Figure 24:
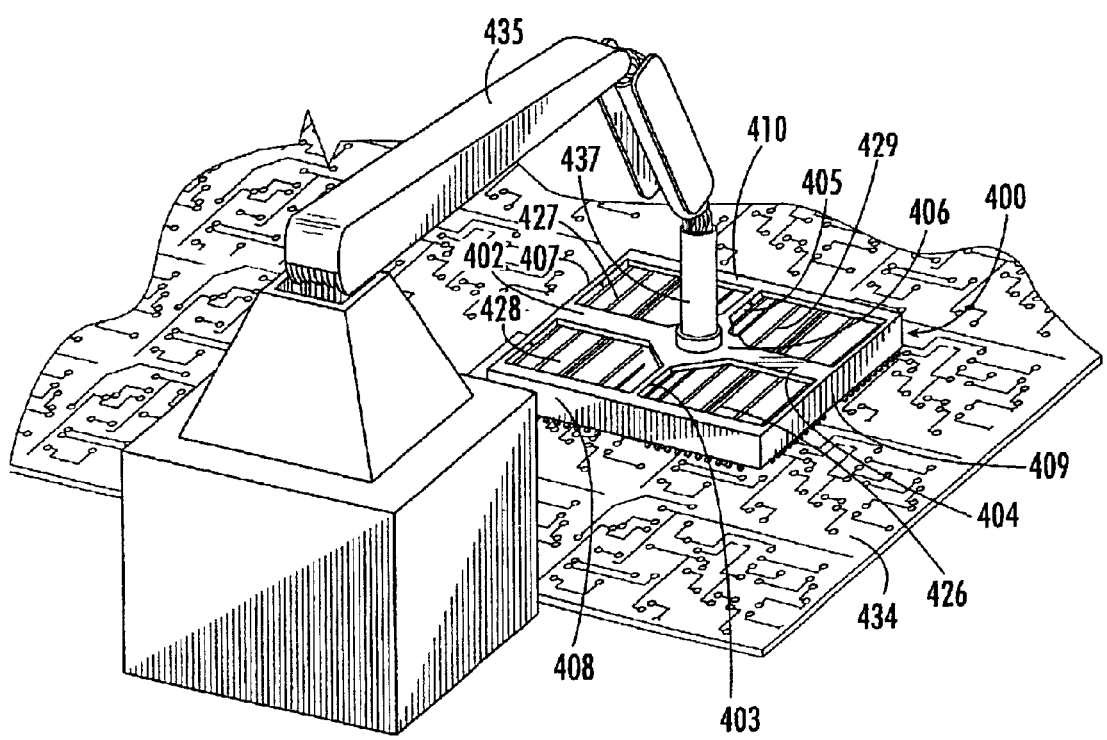
FIG. 24 illustrates a robotic arm precisely placing the assembly of claim 23 upon a circuit board.

FIG. 24 illustrates one means of employing the retaining device 400 to precisely move, place, and then facilitate attachment of electrical connectors upon a circuit board 434. In FIG. 24, the retaining device 400 has been inverted, and a robotic arm 435 picks up the retaining device 400 by means of a suction tip 437 which uses vacuum air force to attach in a reversible manner to suction pad 406 positioned near the center of the retaining device 400. Electrical connector 426, 427, 428, and 429 held within retaining device 400, in an inverted position, thereby making available solder balls for contact with circuit board 434. Once the retaining device 400 with the electrical connectors 426–428 attached is placed against circuit board 434, the assembly is heated to facilitate fusing solder balls to a trace on the circuit board 434, thereby forming an integration of the electrical connectors 426–429 with the circuit board 434, completing the circuit. Once cooling has occurred, then it is possible to simply remove or crop off the retaining device 400, leaving the electrical connectors 426–429 firmly secured to the circuit board 434.

It is possible in other applications to manually place a retaining device 400 in position, or to use some other mechanical means of placing the retaining device 400 upon circuit board 434, using means other than that shown in FIG. 24. Furthermore, a robotic arm 435 with a suction tip 437 as shown in FIG. 24 also could be used for the placement of the retaining device shown in FIGS. 25–26.

Figure 25:
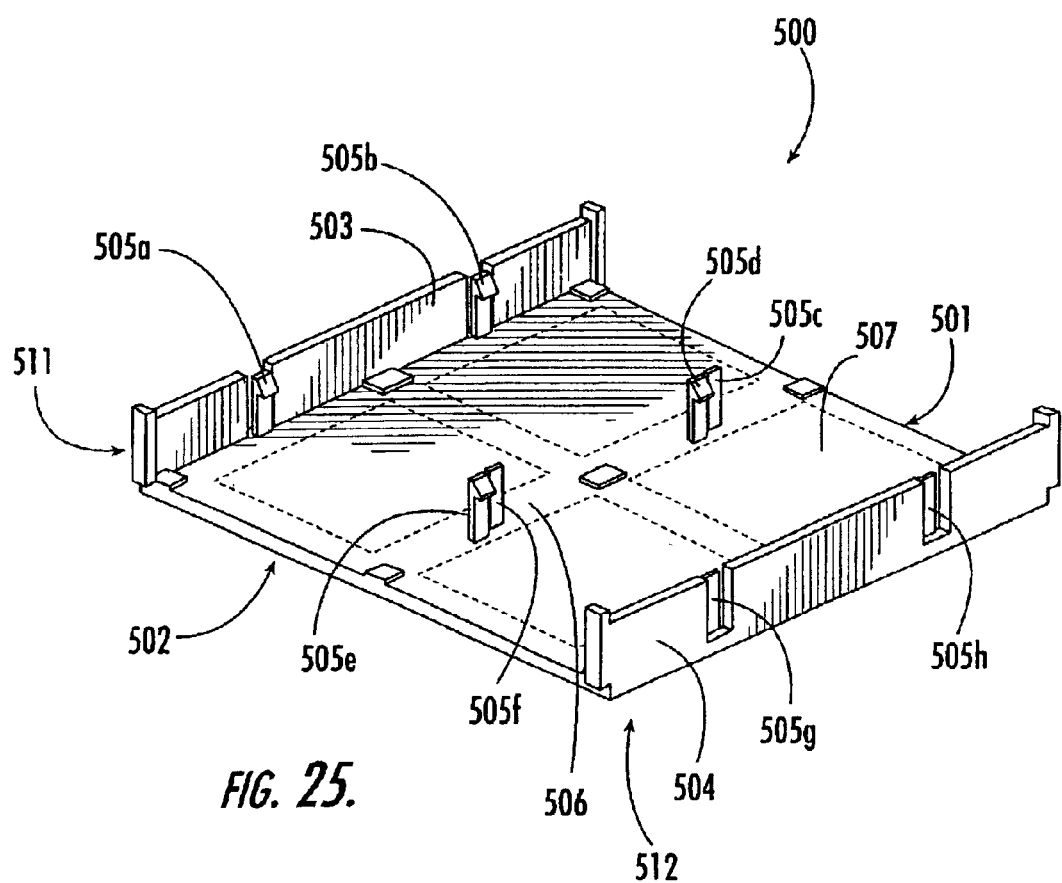
FIG. 25 illustrates yet another embodiment of a retaining device.

Turning to FIG. 25, yet another embodiment of the invention, retaining device 500 is shown having a planar base 501 with a first side 507 (top side) and a second side 502 (opposite or bottom side). The planar base 501 includes a first end 511 and a second end 512. At the first end 511, a first wall 503 is perpendicular to the planar base 501. A second wall 504 is perpendicular to the planar base 501 as well. The embodiment shown in FIG. 25 contains only two walls and a planar base 501, but it would be equally possible for one wall, three walls, four walls, or more (in the case of a multi-sided structure) to be provided upon a planar base 501 in the practice of the invention. A retention mechanism comprising resilient members 505a–h is shown in FIG. 25. One or more of the resilient members 505a–h may include an elongated body, with the elongated body having a first end and a second end, the first end being affixed to planar base 501 and the second end having a hooked portion. The hooked portion may be oriented for bearing against and restraining electrical connectors against the planar base 501, as will be further described herein with respect to FIG. 26.

The second side 502 (i.e.: bottom side as seen in FIG. 25) of the planar base 501 may receive a suction force that facilitates movement and placement of the retaining device 500, similar to that shown in FIG. 24. The retaining device 500 may include a mid-line 506 along its center, with opposing resilient members 505a–h in a paired configuration. For example, resilient member 505e is opposed and paired with resilient member 505g, to secure electrical connector 510d from two sides as further shown in FIG. 26. Similar pairings of resilient members 505a–h include the following pairs: (1) 505a/505f, (2) 505b/505c, (3) 505d/505h. In other applications of the invention, it would be possible to have more or less resilient members 505a–h to hold each respective electrical connector 510a–d. However, the particular embodiment shown in FIG. 5 employs two paired resilient members for each electrical connector 510a–d.

Figure 26:
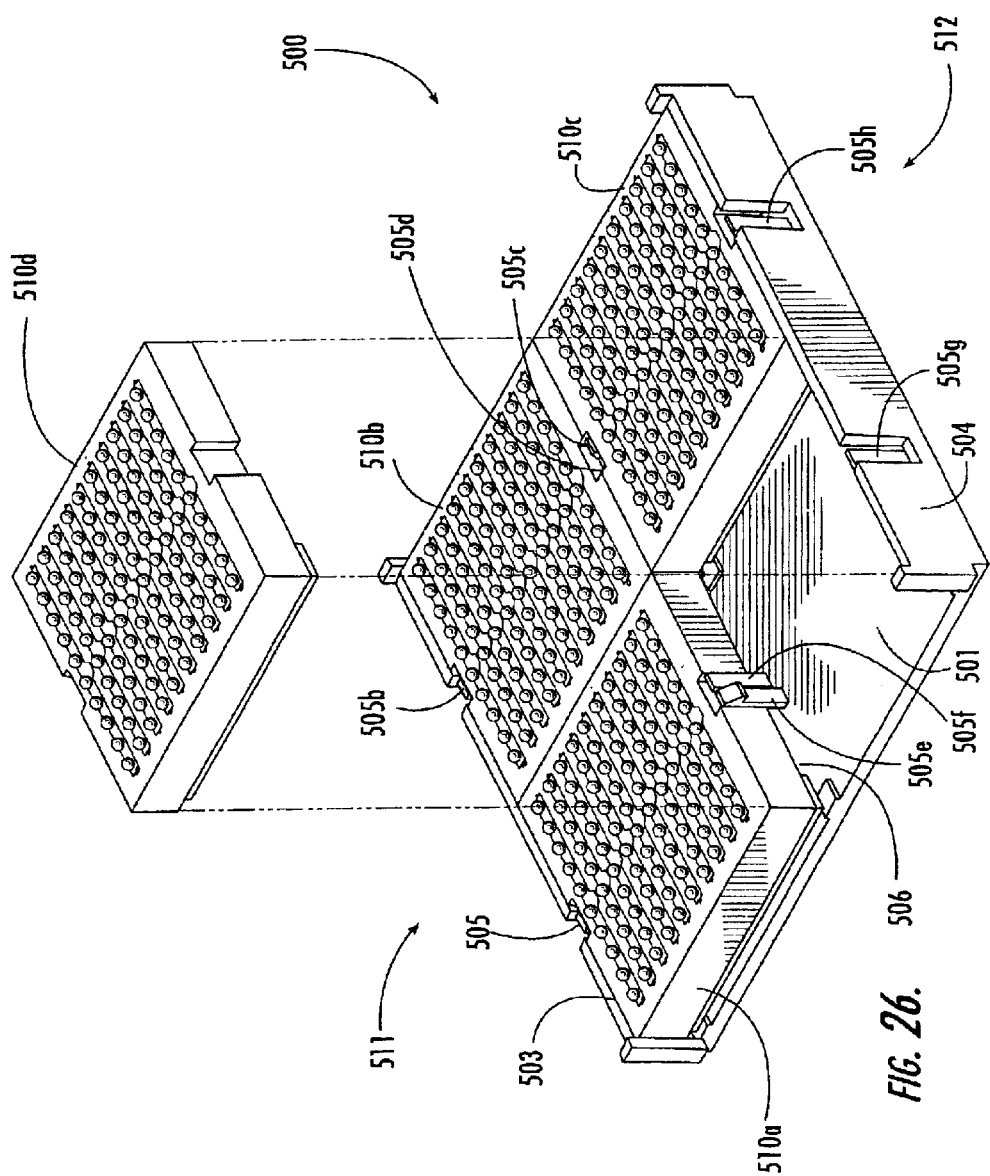
FIG. 26 depicts the retaining device shown in FIG. 25, with several electrical connectors inserted for retention and one electrical connector shown in expanded view above the retaining device.

In FIG. 26, electrical connectors 510a–d are shown in position, in which they are being retained or held against planar base 501, according to the practice of the embodiment of the invention shown in FIG. 25. Furthermore, it would be possible for only one, two, three, five, six, or more electrical connectors 510a–d to be held by retaining device 500 in the practice of the invention. Furthermore, other arrangements of resilient members 505a–h could be employed to perform the same or similar retaining function as shown in FIG. 26. In general, the resilient members 505a–h may form opposed pairings in which they act together to apply retention forces upon electrical connectors 510a–d. The opposed resilient members 505a–h may comprise first members positioned adjacent the first end 511 of the planar base 501, and second members positioned adjacent the second end 512 of the planar base 501. Furthermore, third members may be positioned along the mid-line 506, in which the retaining device 500 is configured to hold one or more electrical connectors 510a–d.

It is understood by one of ordinary skill in the art that the present discussion is a description of exemplary embodiments only, and is not intended as limiting the broader aspects of the present invention, which broader aspects are embodied in the exemplary constructions.

What is claimed is:

1. A method for manufacturing an electrical connection unit, the method comprising:

(a) providing a first insulative base and a first set of contacts, said first insulative base having:
  i) a first side located in a top plane,
  ii) a second side opposite the first side, and
  iii) a plurality of apertures extending between said first side and said second side;

(b) inserting said first set of contacts into respective apertures of said first insulative base, said contacts each having a first end and a second end, said first end being positioned near the top plane of said first side;

(c) applying a solder positioning device adjacent said first side of said first insulative base in the top plane, said solder positioning device providing a plurality of cavities positioned in alignment with respective apertures of said first insulative base, wherein said first ends of said first set of contacts are positioned adjacent to cavities within said solder positioning device;

(d) inserting solder portions into said cavities, thereby contacting said respective first ends of said first set of contacts with solder portions;

(e) heating said solder portions, thereby fusing said solder portions with respective first ends of said first set of contacts; and (f) forming a first electrical connection unit comprising an array of fused solder portions in said top plane.

2. The method of claim 1, comprising the additional steps of:
   (g) providing a second electrical connection unit having a first side and a second side, whereby said second connection unit is interchangeable with said first connection unit, and
   (h) mating said second side of said electrical connection unit with said second side of said first connection unit to form an electrical connector array.

3. The method of claim 1, wherein said providing step (a) employs at least one overmolded contact.

4. The method of claim 3 in which said overmolded contact comprises a polymeric material.

5. The method of claim 1 wherein said inserting step (d) comprises wiping a paste upon said solder positioning device.

6. The method of claim 1 wherein said inserting step (d) comprises dropping solder portions into said cavities.

7. The method of claim 1 wherein said solder positioning device comprises a ceramic material.

8. The method of claim 1 wherein said solder positioning device comprises a continuous belt.

9. The method of claim 6 wherein said solder portion comprises a powder.

10. The method of claim 1 wherein said heating step (e) is performed at a temperature of at least about 181 degrees C.

11. The method of claim 10 wherein said solder portion comprises at least about 50% Sn (tin).

12. The method of claim 1 wherein said first insulative base is substantially flat in said top plane.

13. The method of claim 12 wherein said solder portions collectively comprise a solder ball array, said solder balls projecting above the top plane of said first insulative base.

14. A method of manufacturing an electrical connection array, the method comprising:
   (a) providing a first insulative base, said first insulative base comprising:
      i) a first side located in a top plane;
      ii) a second side opposite said first side;
      iii) an edge comprising interlocking nubs;
      iii) an aperture extending from said first side to said second side, and
      iv) a contact extending within said aperture from said first side to said second side, said contact comprising a first end positioned adjacent said first side of said insulative base in the top plane;
   (b) applying a solder positioning means upon said first side of said first insulative base in said top plane, said solder positioning means comprising a cavity in alignment with said aperture of said first insulative base, whereby said first end of said contact is positioned adjacent to or within said cavity;
   (c) inserting into said cavity a solder portion;
   (d) contacting said first end of said contact with said solder portion;
   (e) heating said solder portion;
   (f) fusing said solder portion to said first end of said contact; and
   (g) forming an electrical connection unit having a fused solder portion in said top plane.

15. The method of claim 14 wherein said providing step (a) additionally comprises the steps of
   providing a second insulative base having interlocking nubs along an edge, and
   combining said first and said second insulative bases to form a modular array.

16. The method of claim 14 wherein said solder positioning means comprises a first surface and a second surface, an alignment ledge being provided on said second surface, the second surface being applied in contact with said first insulative base, further wherein alignment of said solder positioning means in step (b) is facilitated by employment of an alignment ledge on the second surface of said solder positioning means.

17. The method of claim 14, additionally comprising the step of:
   (h) removing said solder positioning means from said first insulative base; and
   (i) repeating steps (a)–(g) for successive insulative bases in a continuous manufacturing operation.

18. A method of manufacturing a connector, the method comprising:
   (a) providing a first insulative base, the first insulative base having:
      i) a lower side,
      ii) an upper side, and
      iii) an aperture extending from the lower side to the upper side, and
      iv) a contact within said aperture, said contact extending from said lower side to said upper side, said contact having a first end positioned near the lower side of said first insulative base;
   (b) providing a solder carrier, said solder carrier having a notch on its upper surface,
   (c) depositing a solder portion into said notch, thereby forming a loaded notch;
   (d) placing said loaded notch in alignment with said aperture of said first insulative base, such that said first end of said contact is positioned adjacent to or within said loaded notch;
   (e) heating said solder portion;
   (f) fusing said solder portion to said first end of said contact; and
   (g) forming an electrical connection unit having a fused solder portion.

19. The method of claim 18 wherein said solder portion comprises a solder paste.

20. The method of claim 18 wherein said solder portion comprises a solder ball.

21. The method of claim 18, additionally comprising the additional steps of:
   (h) removing said solder carrier from said lower surface of said first insulative base; and
   (i) repeating steps (a)–(h) for successive insulative bases by employing successive solder portions, thereby providing a continuous manufacturing operation.

22. The method of claim 21 in which said solder carrier comprises a solder positioning carrier belt, wherein the step (i) comprises in part rotating successive insulative bases upon said solder positioning carrier belt, thereby fusing said successive solder portions.

23. The method of claim 22 wherein said solder positioning carrier belt advances said successive insulative bases through an oven.

24. The method of claim 18 wherein said solder carrier comprises a high temperature resistant material.

25. The method of claim 24 wherein said solder carrier comprises a polymeric material.

26. The method of claim 18 wherein said heating step is performed at a temperature of at least about 181° C.

* * * * *